US012562202B2

(12) United States Patent
Matsushita

(10) Patent No.: US 12,562,202 B2
(45) Date of Patent: Feb. 24, 2026

(54) MEMORY DEVICE SUPPLYING CURRENT TO FIRST MEMORY CELL BASED ON A FIRST CURRENT AND A SECOND CURRENT FLOWING IN SECOND MEMORY CELLS

(71) Applicant: Kioxia Corporation, Tokyo (JP)

(72) Inventor: Naoki Matsushita, Seoul (KR)

(73) Assignee: Kioxia Corporation, Tokyo (JP)

( * ) Notice: Subject to any disclaimer, the term of this patent is extended or adjusted under 35 U.S.C. 154(b) by 186 days.

(21) Appl. No.: 18/463,418

(22) Filed: Sep. 8, 2023

(65) Prior Publication Data

US 2024/0312505 A1 Sep. 19, 2024

(30) Foreign Application Priority Data

Mar. 14, 2023 (JP) ................................. 2023-039662

(51) Int. Cl.
*G11C 11/16* (2006.01)
(52) U.S. Cl.
CPC ...... *G11C 11/1673* (2013.01); *G11C 11/1675* (2013.01); *G11C 11/1697* (2013.01)
(58) Field of Classification Search
CPC ............ G11C 11/1697; G11C 11/1675; G11C 11/1673
USPC ........................................................ 365/158
See application file for complete search history.

(56) References Cited

U.S. PATENT DOCUMENTS 7,429,887 B2 9/2008 Sumita et al.
8,923,032 B2 * 12/2014 Shimakawa ......... G11C 13/004
365/148
10,395,730 B2 8/2019 Mori et al.
2003/0081450 A1 * 5/2003 Hidaka ................... G11C 11/16
365/158
2003/0174536 A1 * 9/2003 Hidaka .................. G11C 11/15
365/158
2004/0001353 A1 * 1/2004 Hidaka ............... G11C 11/1675
365/171

(Continued)

FOREIGN PATENT DOCUMENTS

JP 5386534 B2 10/2013
JP 5390732 B1 10/2013
JP 6524109 B2 5/2019

OTHER PUBLICATIONS

U.S. Appl. No. 18/180,003, First Named Inventor: Naoki Matsushita; Title: "Forming Method of Memory Device"; filed Mar. 7, 2023.

*Primary Examiner* — Sung Il Cho
(74) *Attorney, Agent, or Firm* — Holtz, Holtz & Volek PC

(57) ABSTRACT

According to one embodiment, a memory device includes a first memory cell, a second memory cell, a first interconnect connected to the first memory cell and the second memory cell, a second interconnect connected to the second memory cell, and a third circuit. The third circuit includes a first circuit connectable to the first interconnect and the second interconnect and a second circuit connectable to the first interconnect and the second interconnect. During a write operation or a read operation for the first memory cell, the first circuit outputs a first current to be supplied to the first memory cell, the second circuit outputs a third current based on a second current which flows through the second interconnect, and the third circuit supplies a sum of the first current and the third current to the first interconnect.

20 Claims, 19 Drawing Sheets

(56)　　　　　　　References Cited

U.S. PATENT DOCUMENTS

2018/0204615 A1 *　7/2018　Katayama ........... G11C 11/1675
2020/0098411 A1　3/2020　Maekawa et al.
2022/0293176 A1　9/2022　Matsushita
2023/0073548 A1　3/2023　Matsushita

* cited by examiner

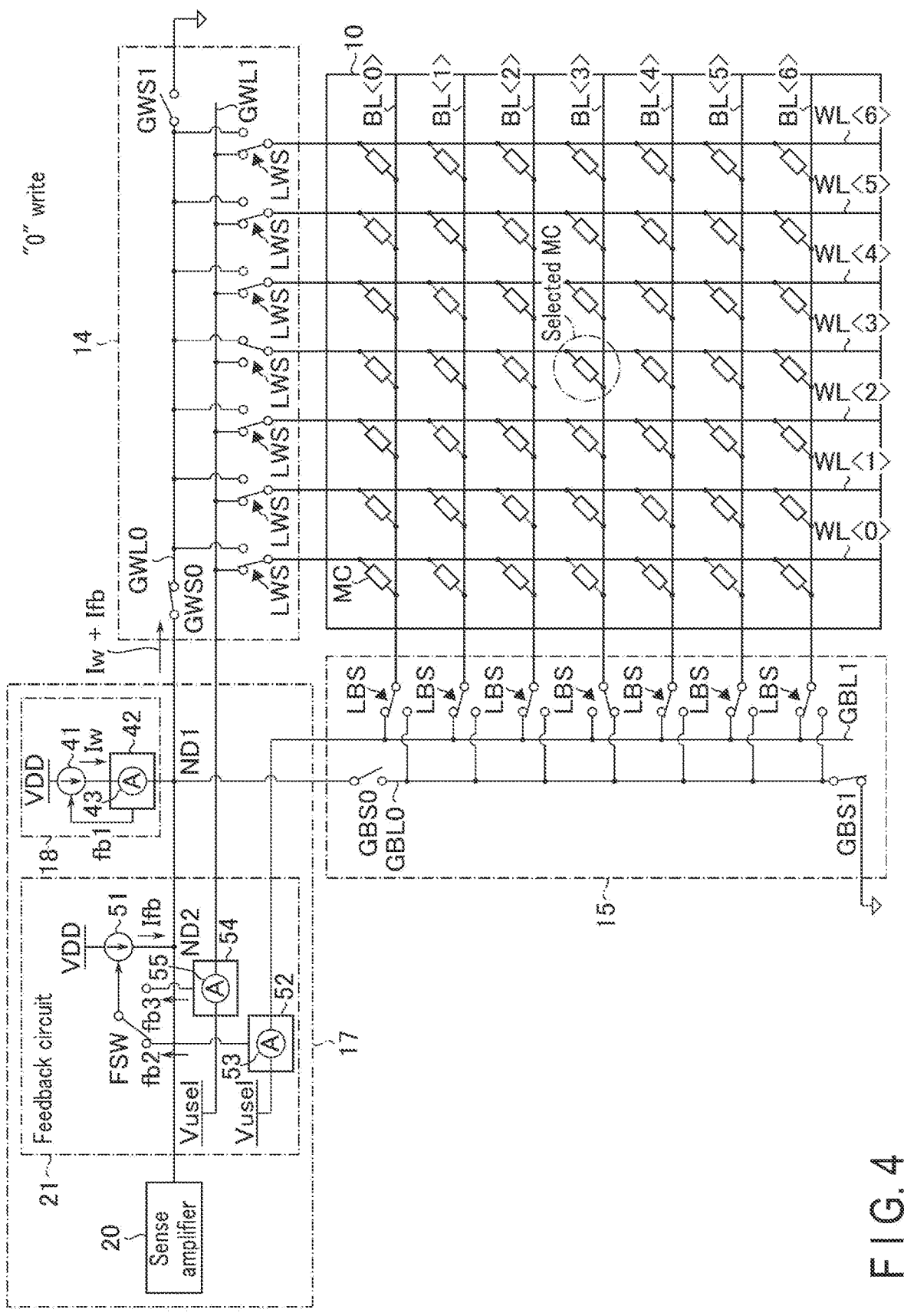
F I G. 4

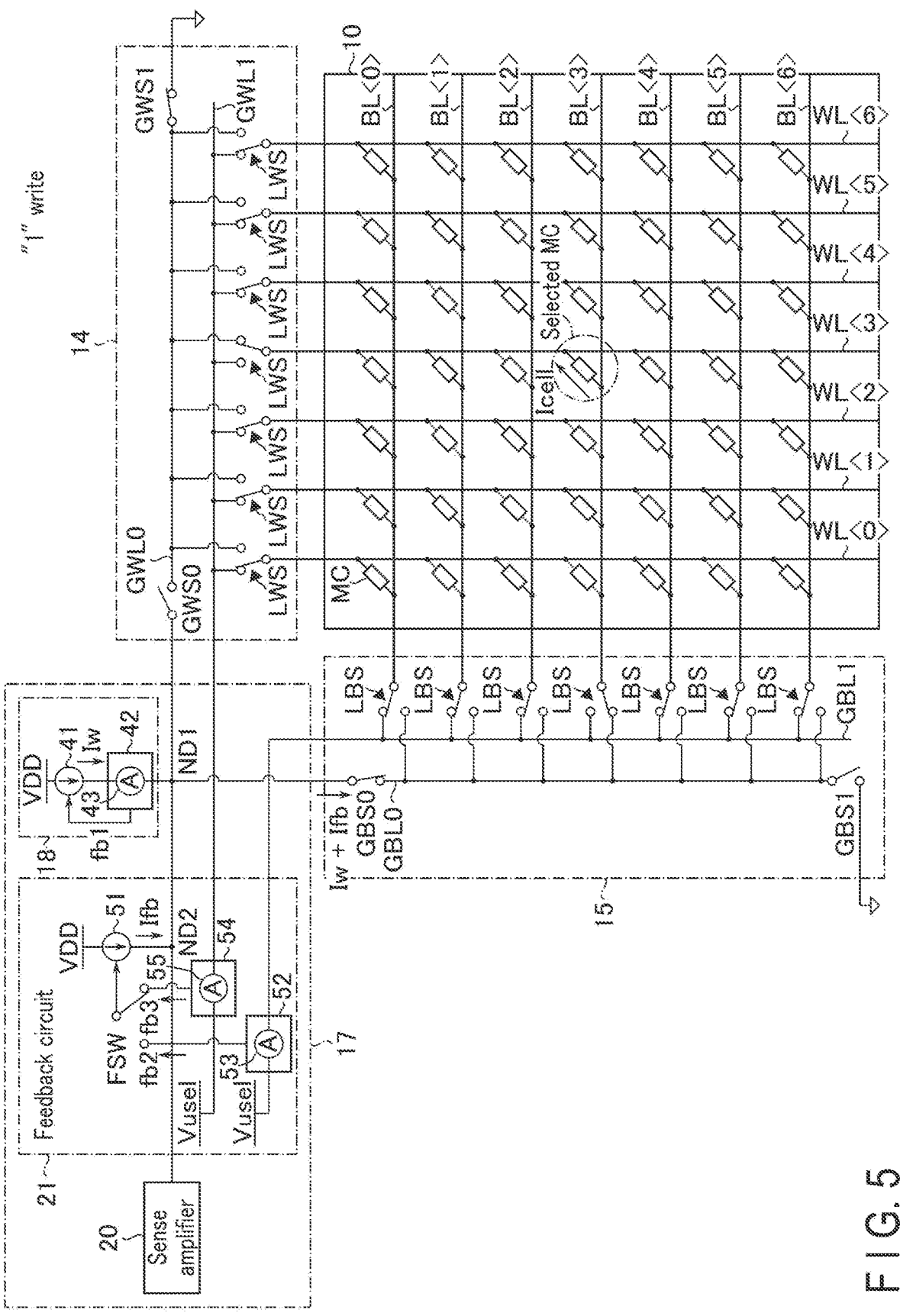
F I G. 5

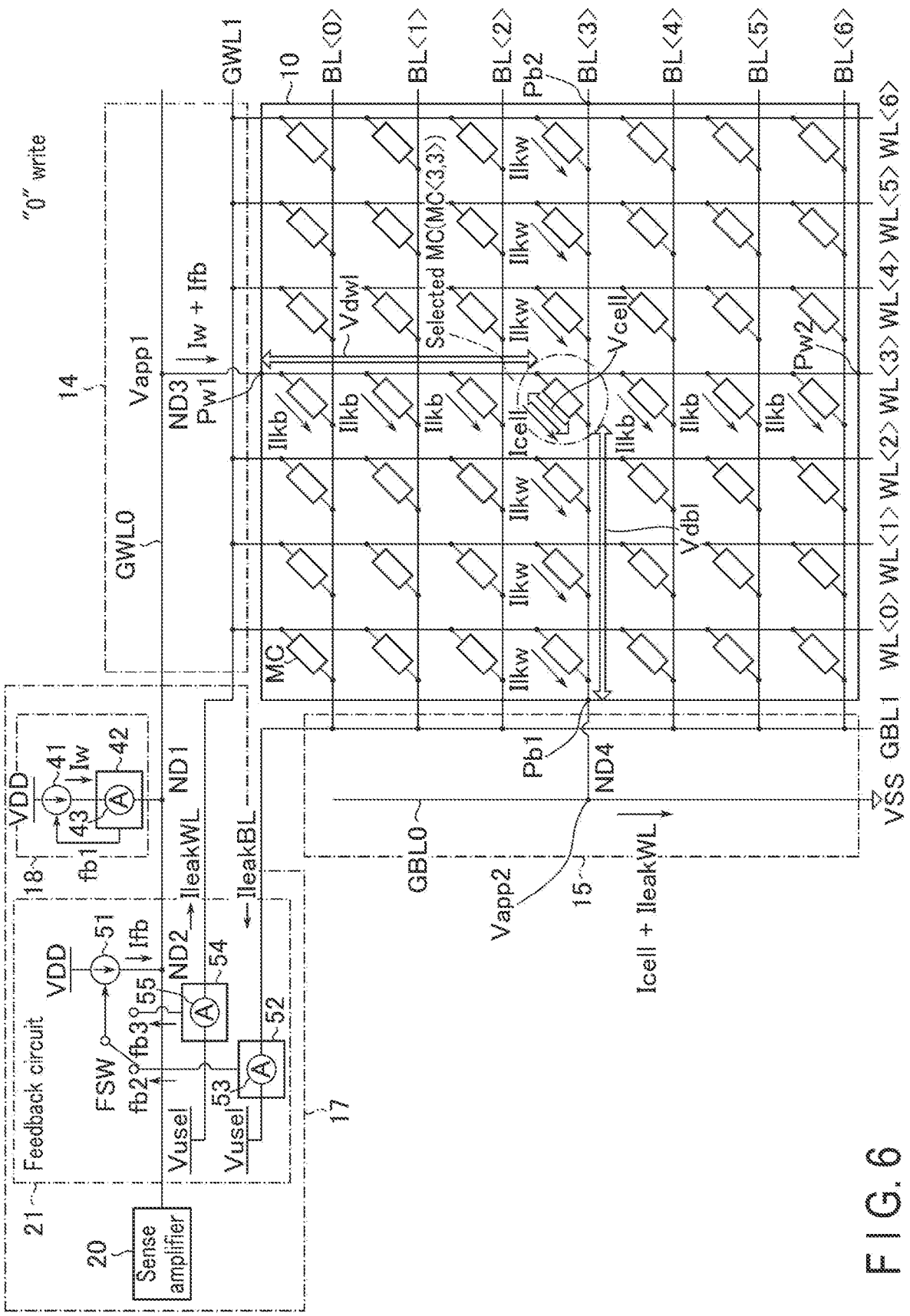
F I G. 6

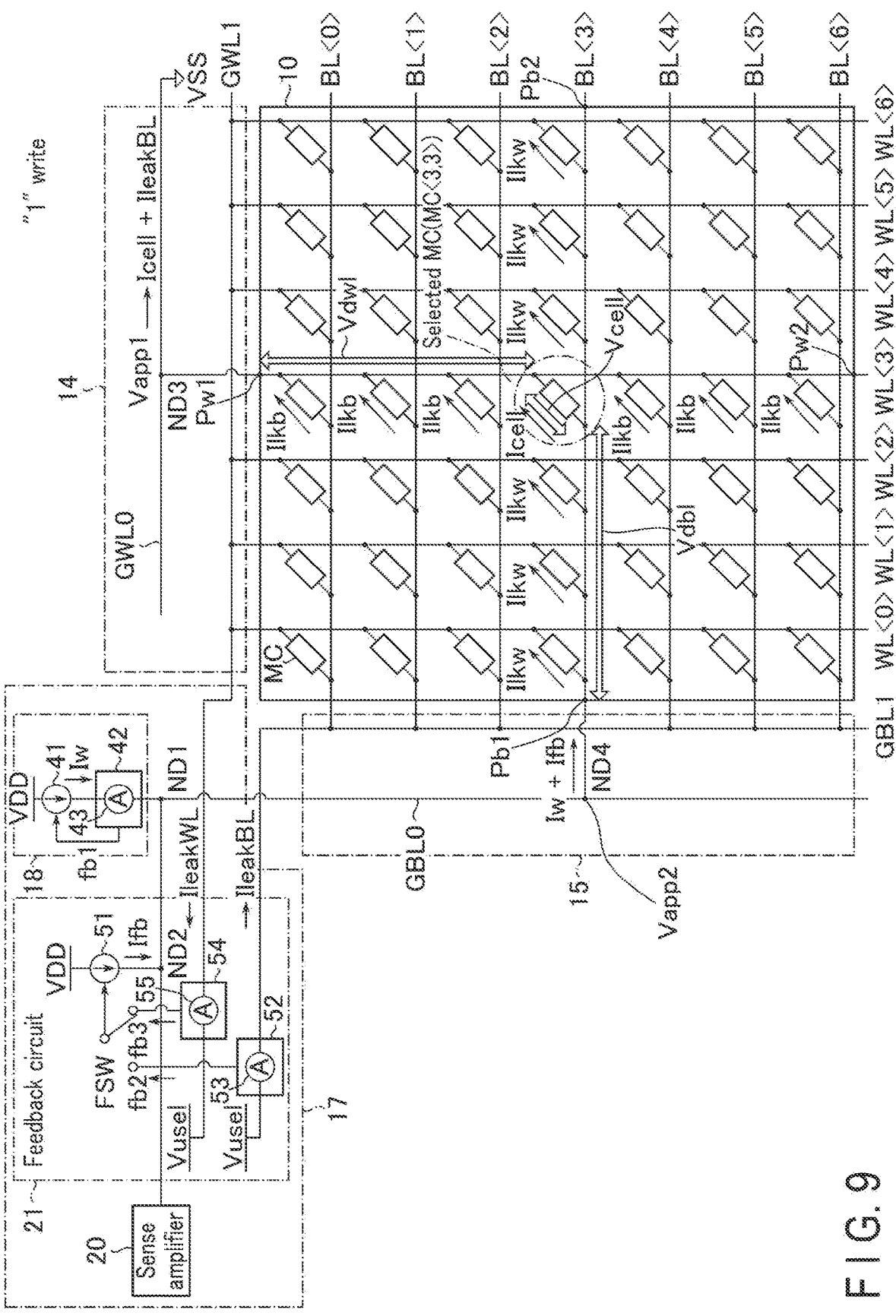
F I G. 9

"0" write
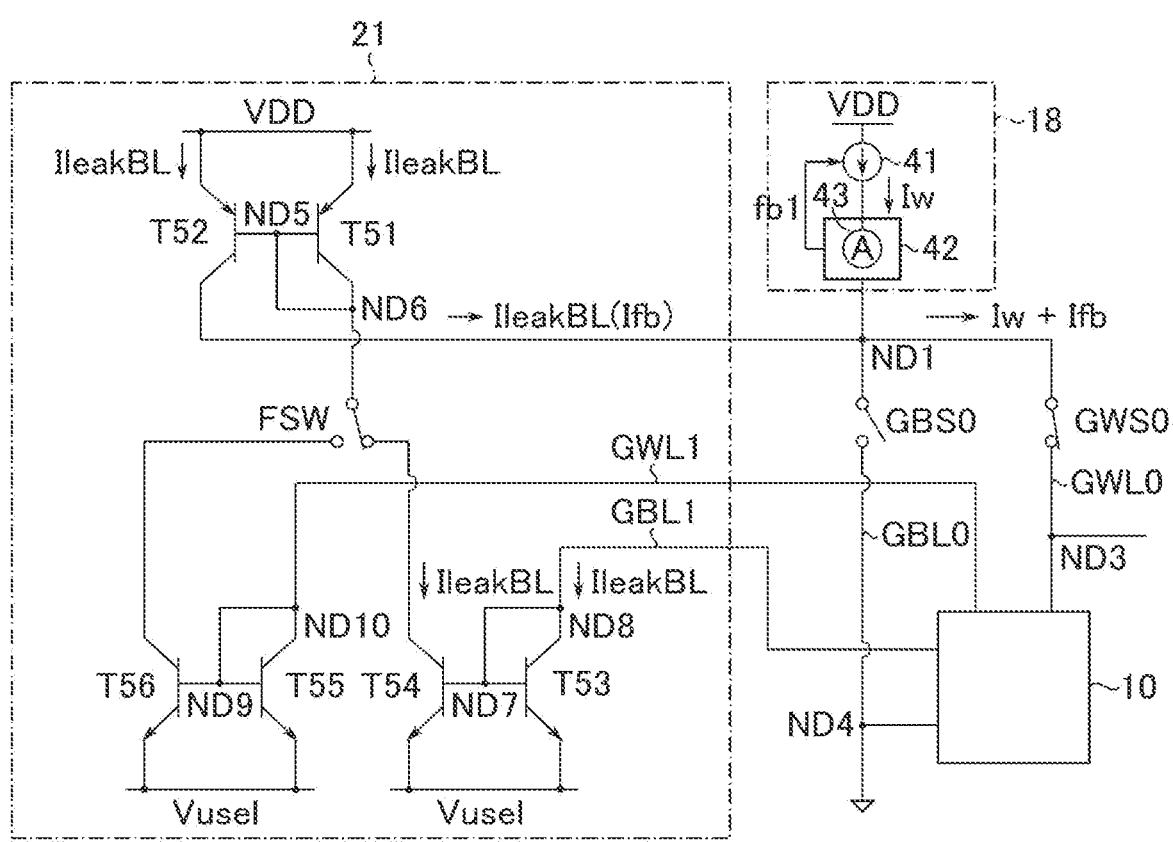
F I G. 10

"1" write
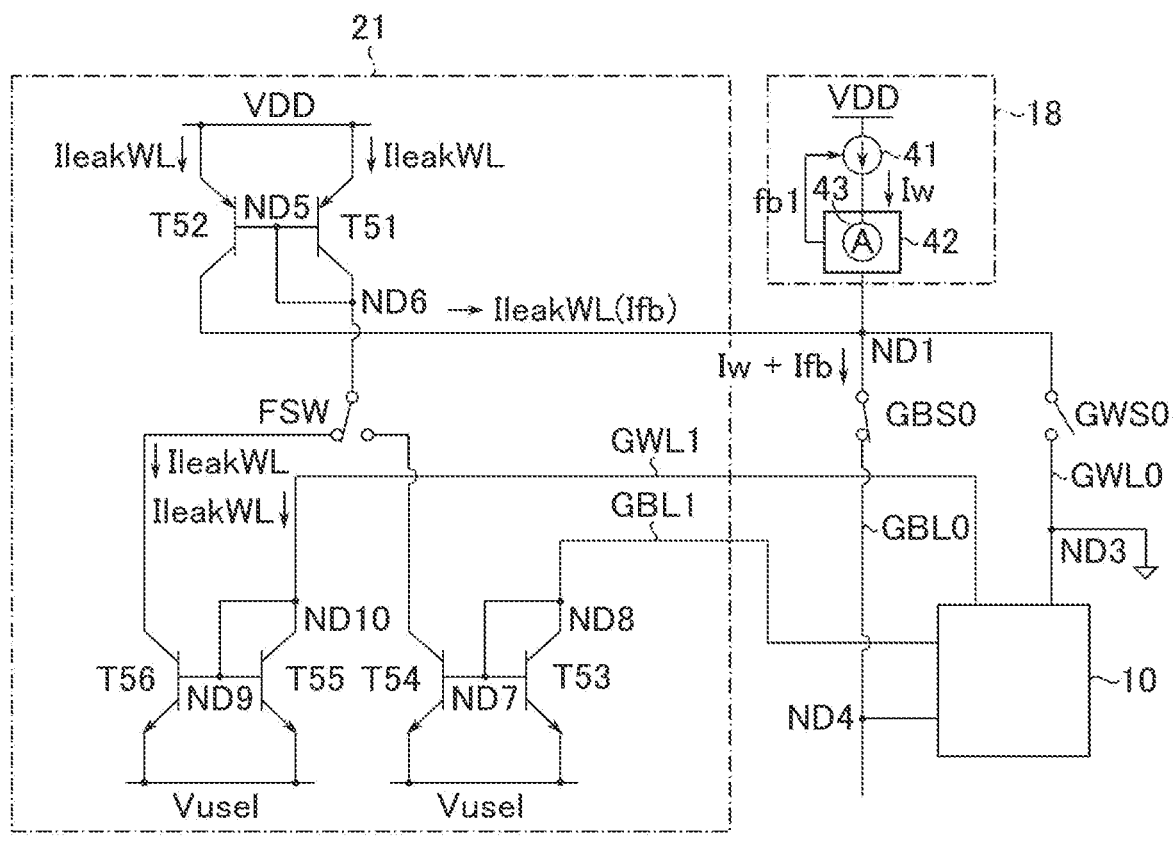
F I G. 11

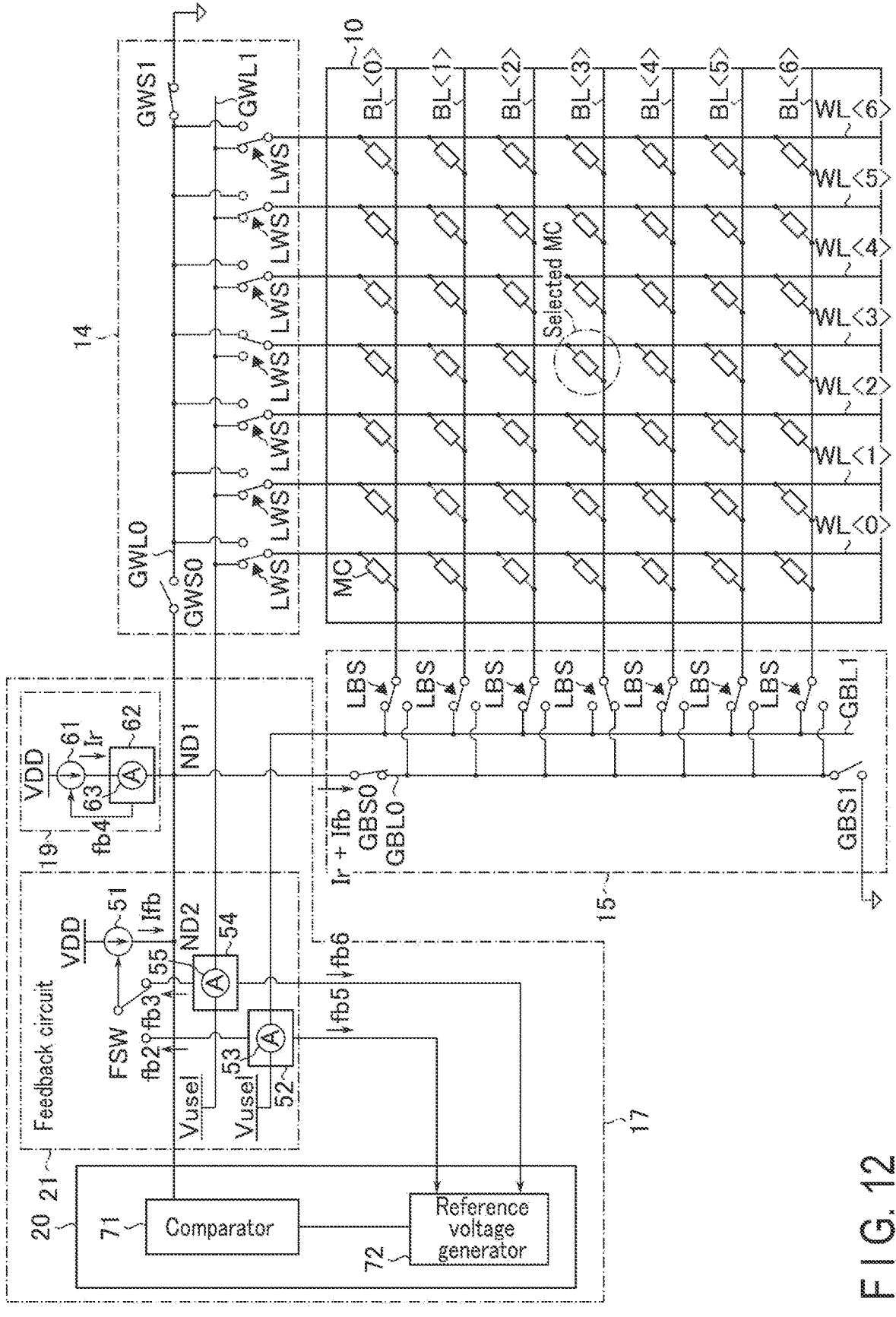
F I G. 12

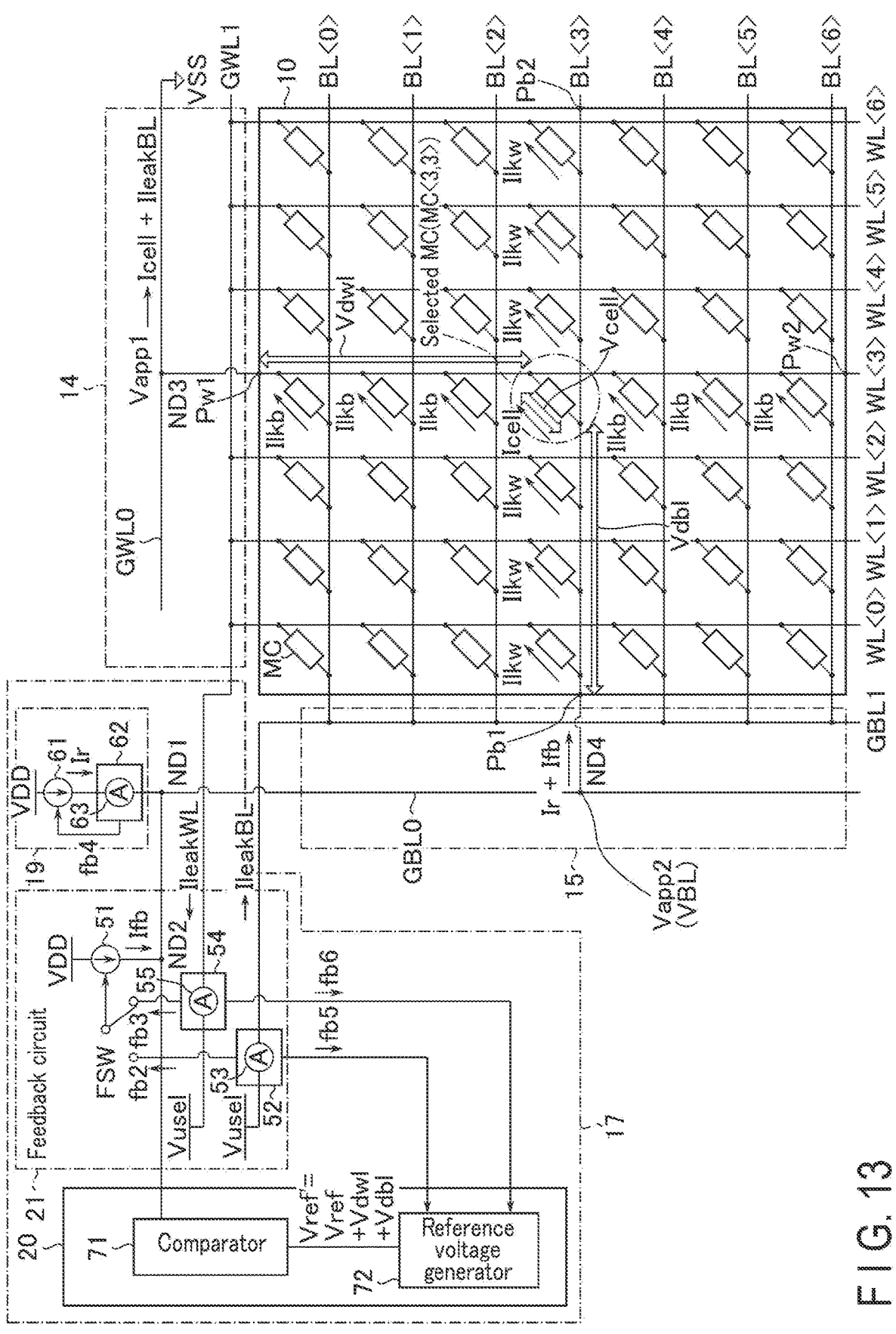
F I G. 13

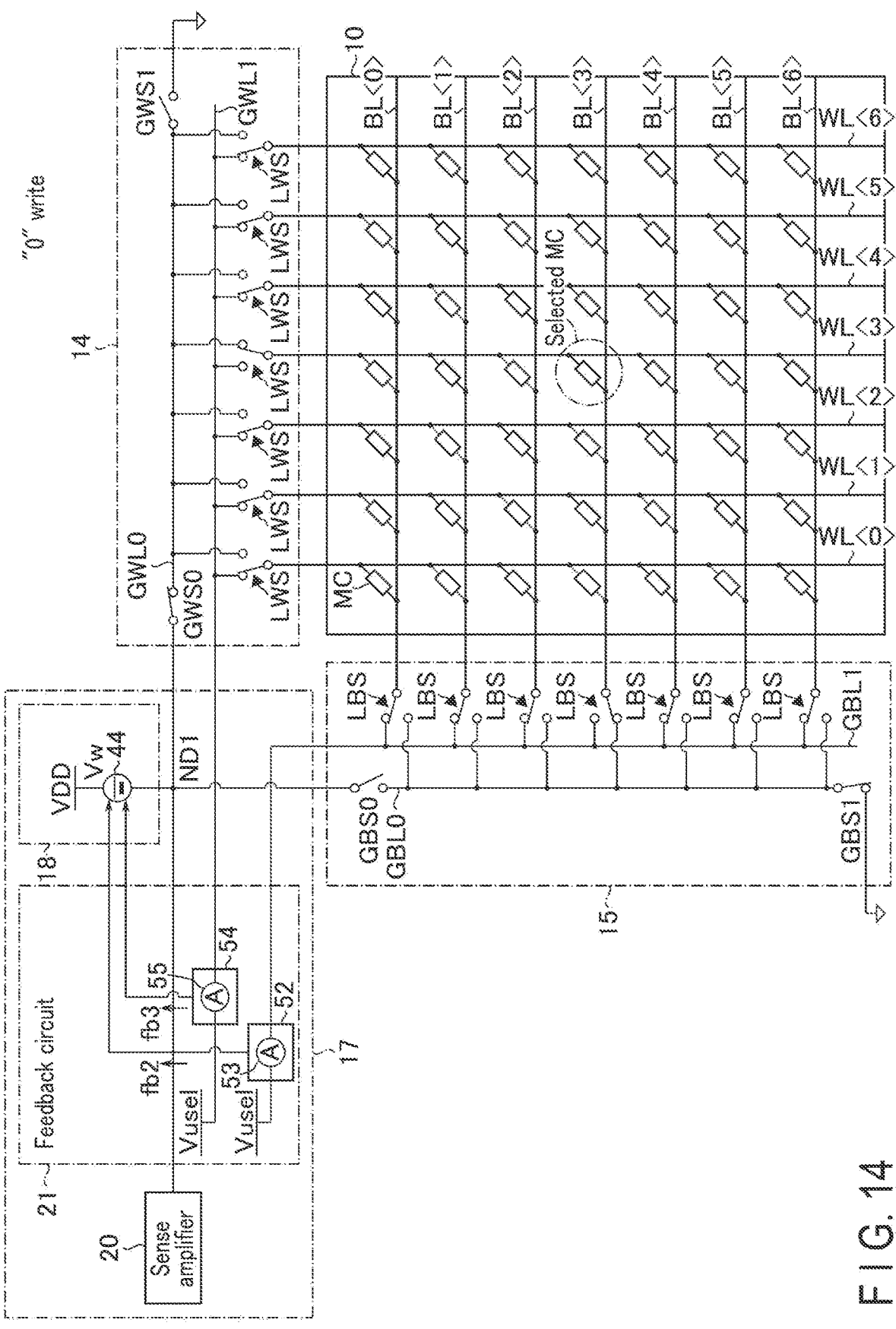
F I G. 14

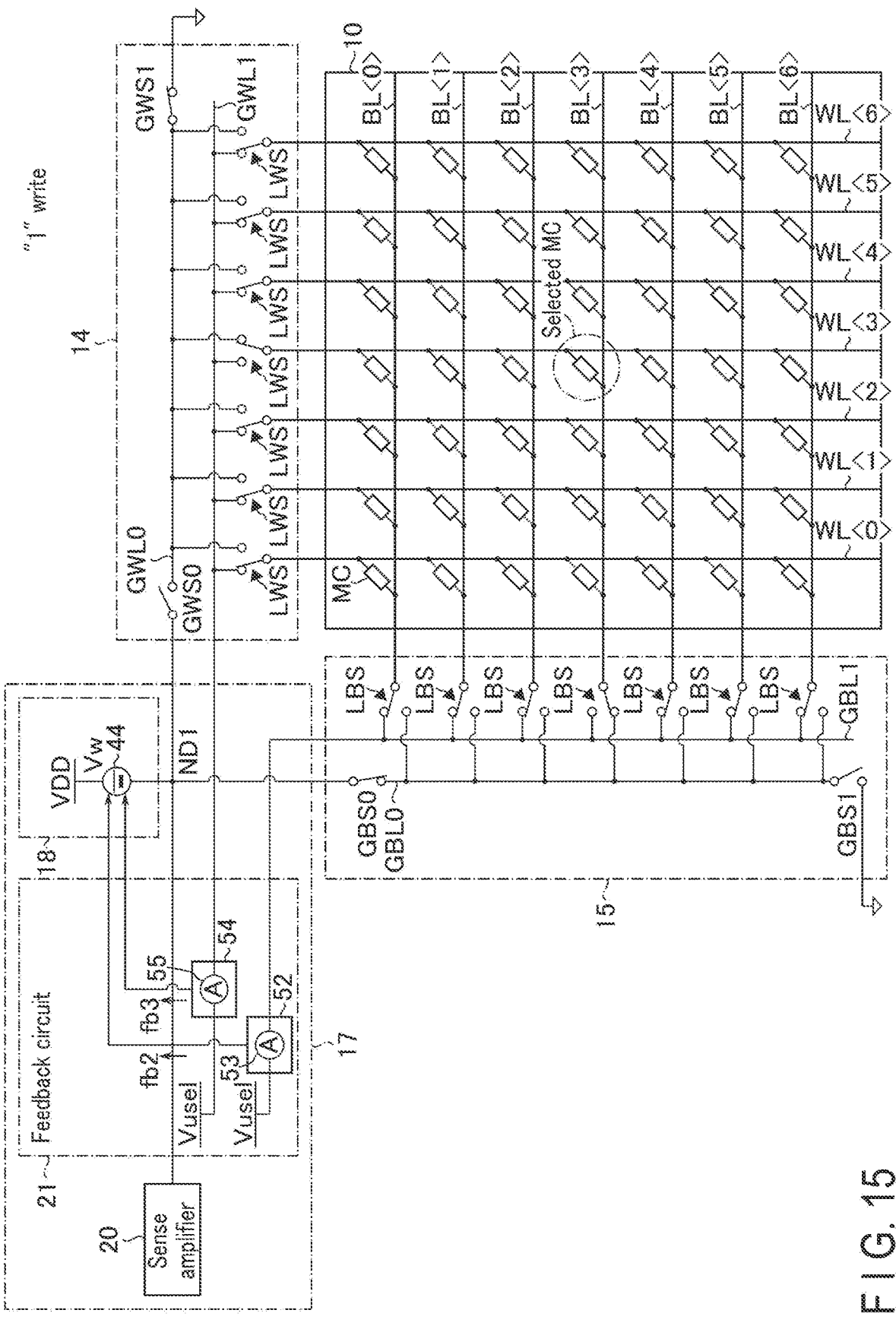
F I G. 15

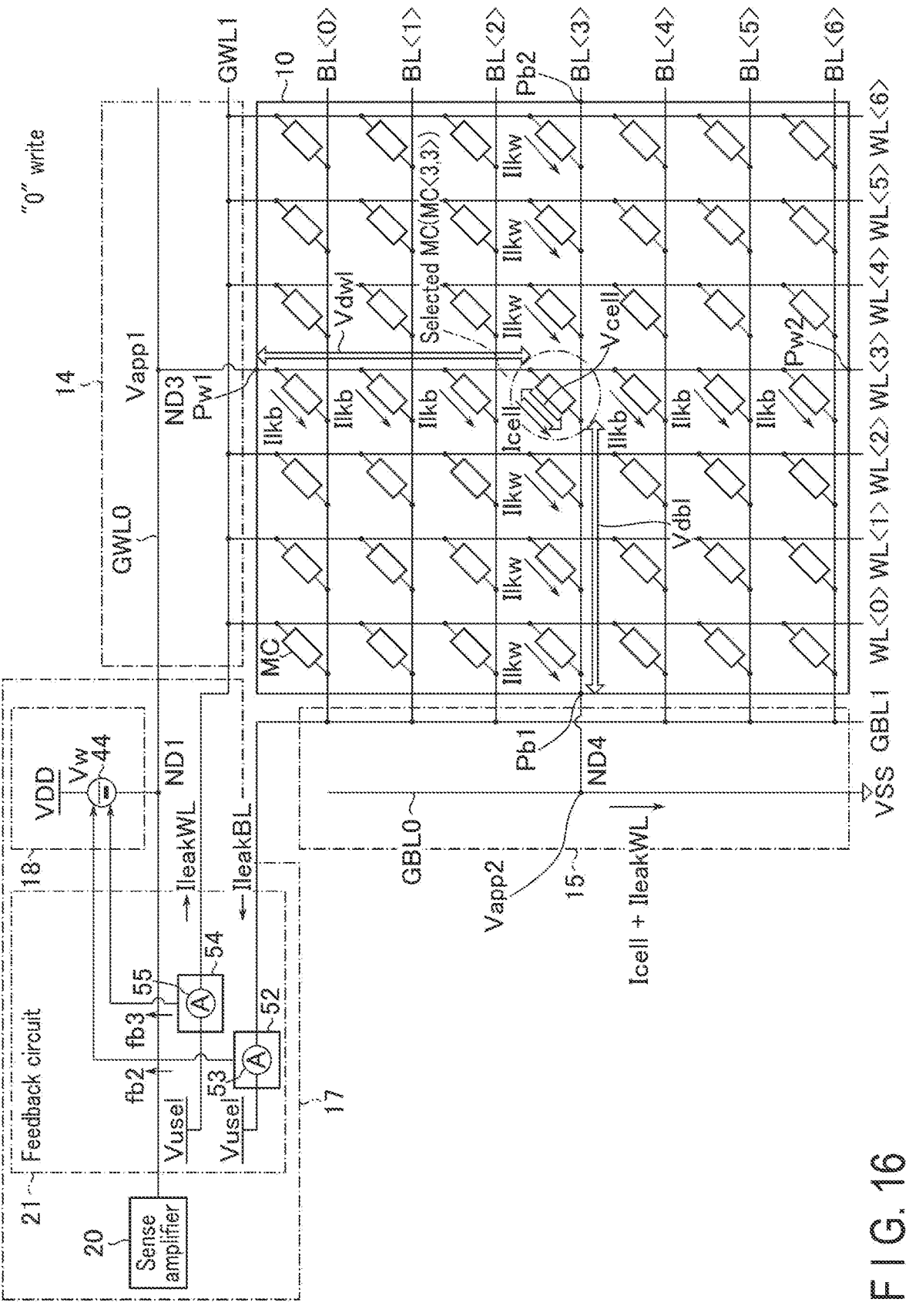
F I G. 16

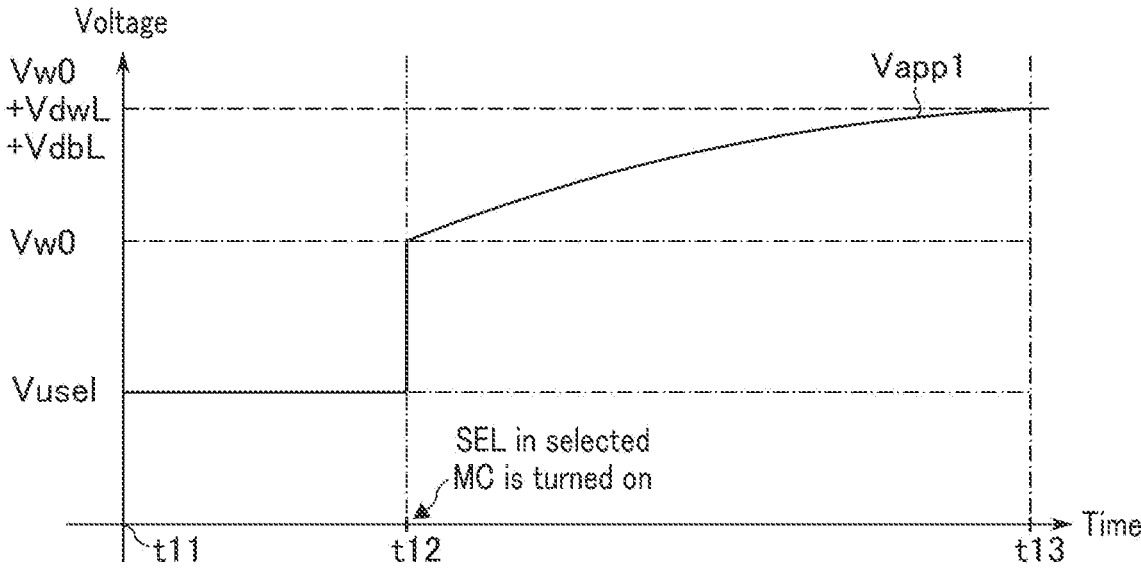
F I G. 17
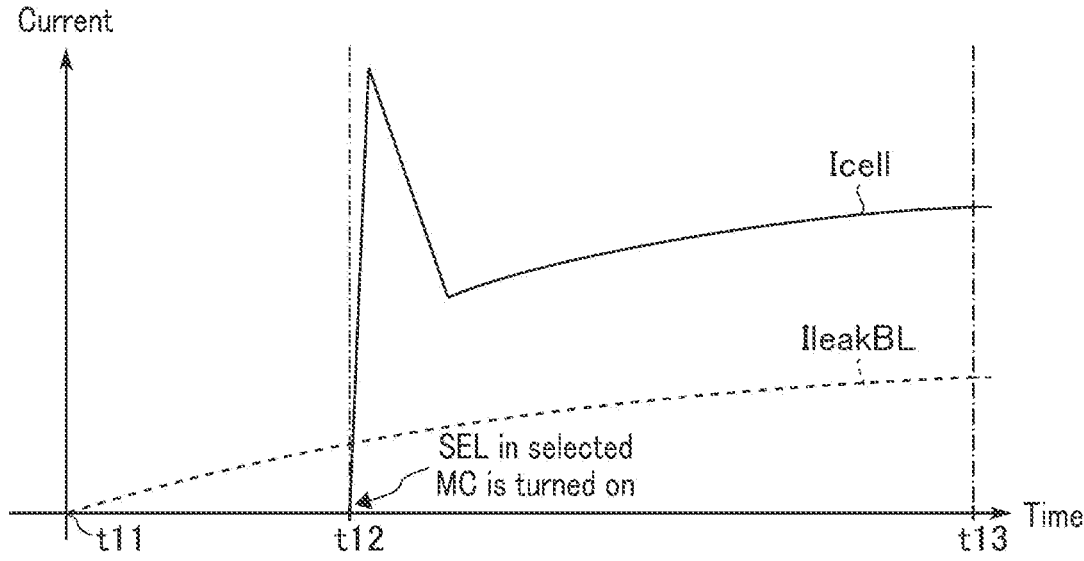
F I G. 18

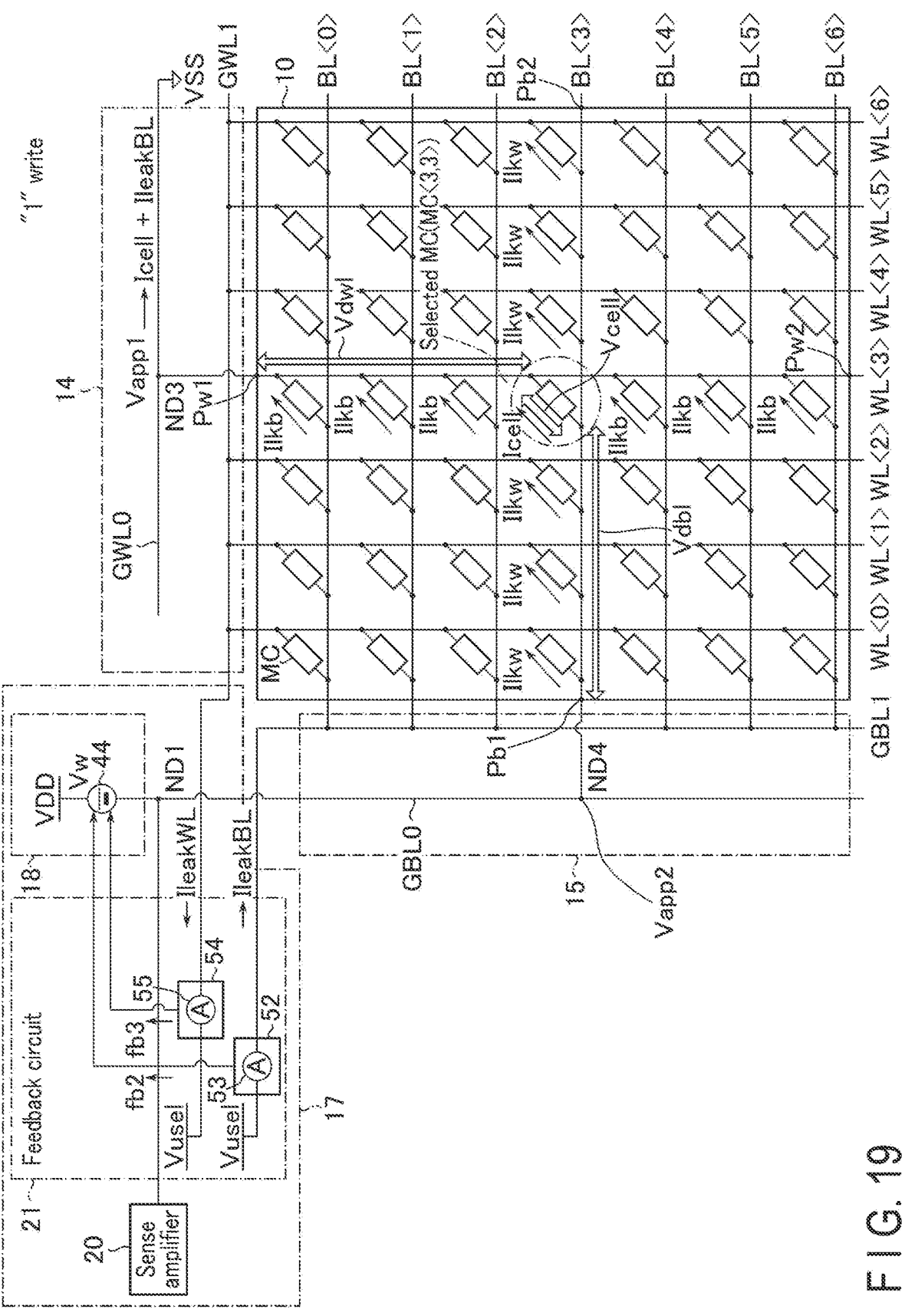
F I G. 19

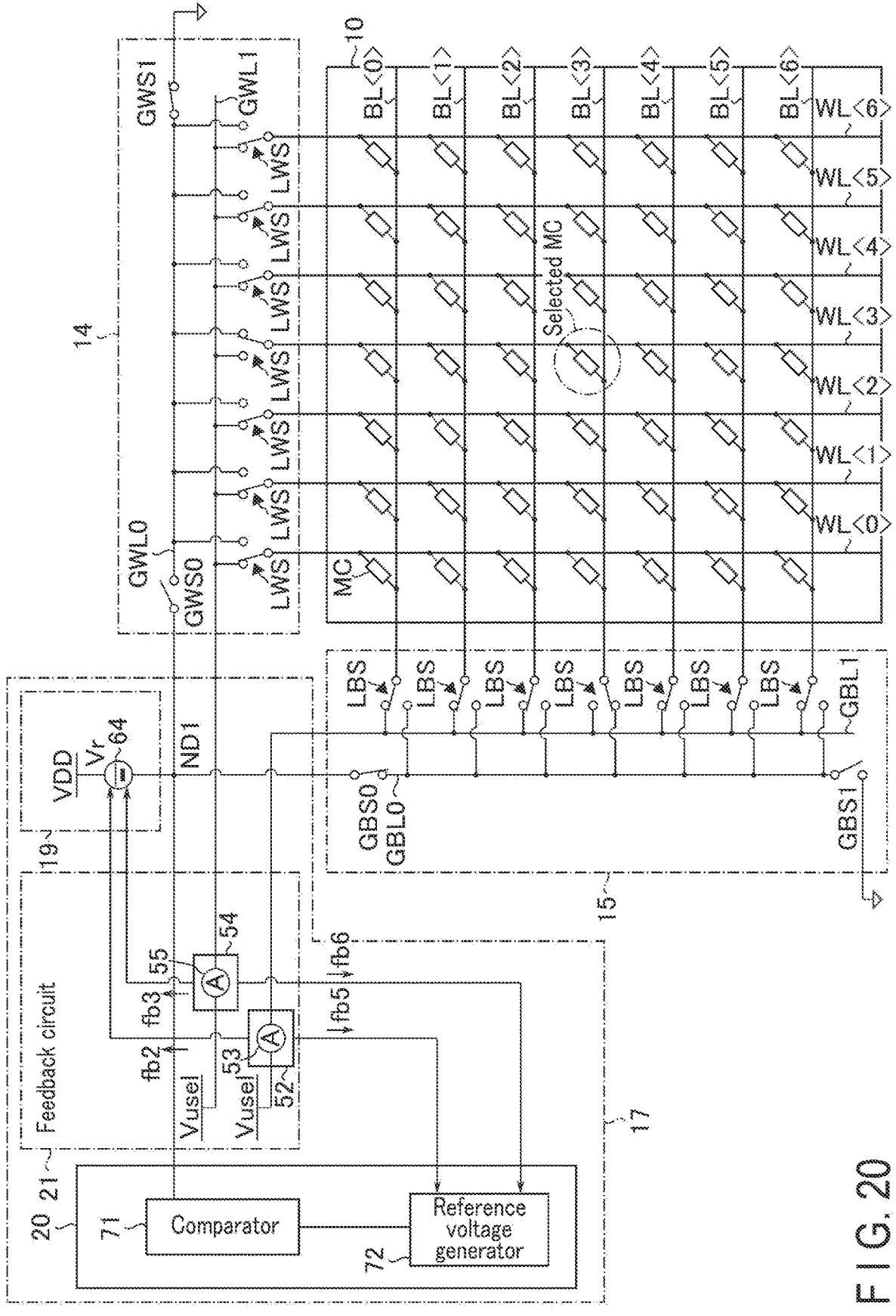
F I G. 20

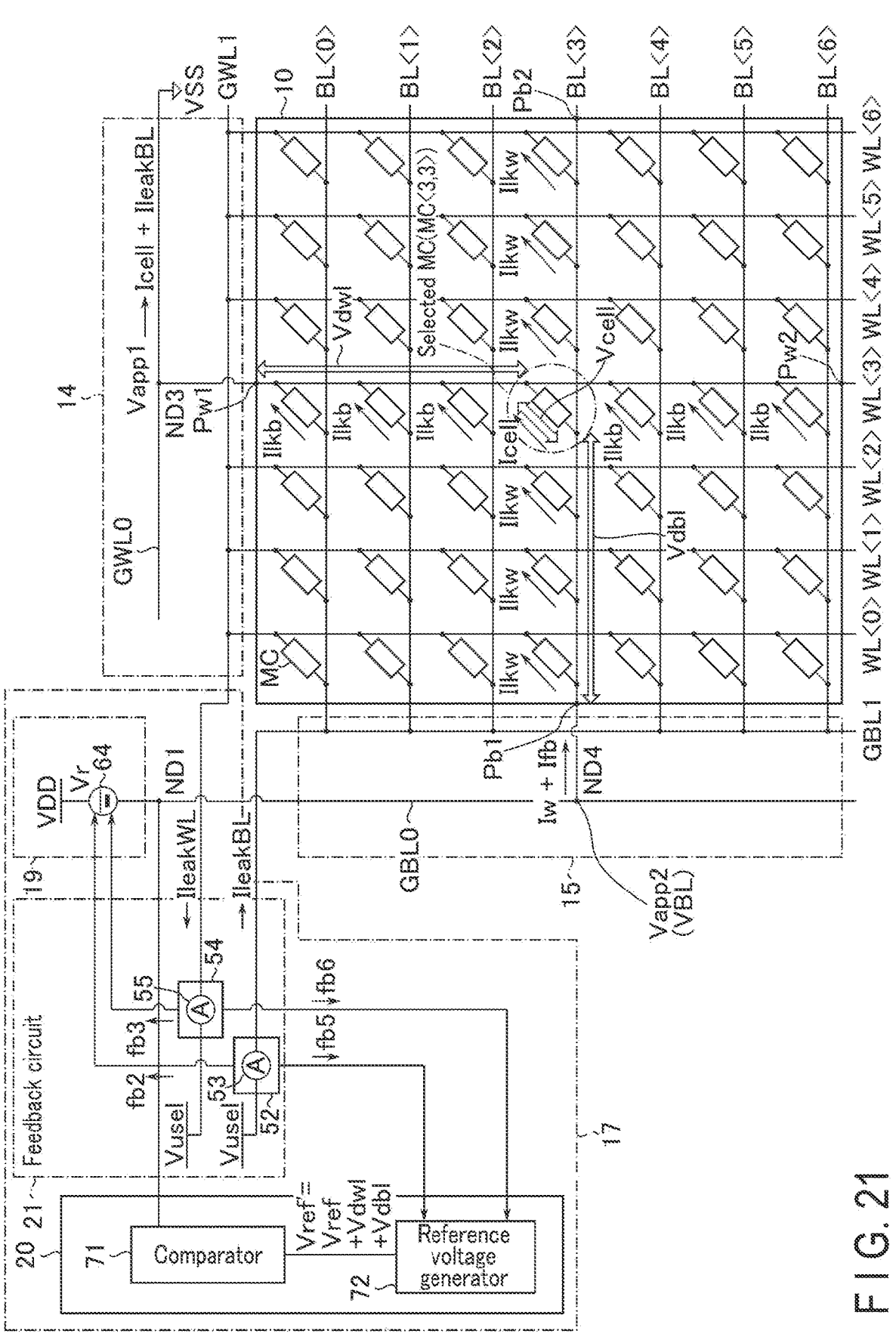
F I G. 21

MEMORY DEVICE SUPPLYING CURRENT TO FIRST MEMORY CELL BASED ON A FIRST CURRENT AND A SECOND CURRENT FLOWING IN SECOND MEMORY CELLS

CROSS-REFERENCE TO RELATED APPLICATIONS

This application is based upon and claims the benefit of priority from Japanese Patent Application No. 2023-039662, filed Mar. 14, 2023, the entire contents of which are incorporated herein by reference.

FIELD

Embodiments described herein relate generally to a memory device.

BACKGROUND

A memory device using a variable resistance element as a memory element is known. For example, a magnetoresistive random access memory (MRAM) using a magnetoresistance effect element as a variable resistance element is known.

BRIEF DESCRIPTION OF THE DRAWINGS

FIG. 4 is a circuit diagram showing an example of a configuration of a row selection circuit, a column selection circuit and a write/read circuit included in the memory device according to the first embodiment.

FIG. 5 is a circuit diagram showing an example of a configuration of a row selection circuit, a column selection circuit and a write/read circuit included in the memory device according to the first embodiment.

FIG. 6 is a diagram illustrating a write operation of the memory device according to the first embodiment.

FIG. 9 is a diagram illustrating a write operation of the memory device according to the first embodiment.

FIG. 10 is a circuit diagram showing an example of a configuration of a feedback circuit included in a memory device according to a modification of the first embodiment.

FIG. 11 is a circuit diagram showing an example of a configuration of a feedback circuit included in the memory device according to the modification of the first embodiment.

FIG. 12 is a circuit diagram showing an example of a configuration of a write/read circuit included in a memory device according to a second embodiment.

FIG. 13 is a diagram illustrating a read operation of the memory device according to the second embodiment.

FIG. 14 is a circuit diagram showing an example of a configuration of a write/read circuit included in a memory device according to a third embodiment.

FIG. 15 is a circuit diagram showing an example of a configuration of a write/read circuit included in the memory device according to the third embodiment.

FIG. 16 is a diagram illustrating a write operation of the memory device according to the third embodiment.

FIG. 17 is a graph showing a voltage waveform during a write operation of the memory device according to the third embodiment.

FIG. 18 is a graph showing a current waveform during a write operation of the memory device according to the third embodiment.

FIG. 19 is a diagram illustrating a write operation of the memory device according to the third embodiment.

FIG. 20 is a circuit diagram showing an example of a configuration of a write/read circuit included in a memory device according to a fourth embodiment.

FIG. 21 is a diagram illustrating a read operation of the memory device according to the fourth embodiment.

DETAILED DESCRIPTION

In general, according to one embodiment, a memory device includes a first memory cell, a second memory cell, a first interconnect connected to the first memory cell and the second memory cell, a second interconnect connected to the second memory cell, and a third circuit. The third circuit includes a first circuit connectable to the first interconnect and the second interconnect and a second circuit connectable to the first interconnect and the second interconnect. During a write operation or a read operation for the first memory cell, the first circuit outputs a first current to be supplied to the first memory cell, the second circuit outputs a third current based on a second current which flows through the second interconnect, and the third circuit supplies a sum of the first current and the third current to the first interconnect.

Embodiments will be described below with reference to the drawings. In the following descriptions, components having substantially the same function or configuration will be denoted by the same reference symbol. In the case where components having similar configurations are distinguished from each other in particular, their identical reference symbols may be assigned different letters or numerals.

1. First Embodiment

A memory device according to a first embodiment will be described. The memory device according to the first embodiment is, for example, a magnetoresistive random access memory using an element having a magnetoresistance effect by a magnetic tunnel junction (MTJ), which is also referred to as an MTJ element or a magnetoresistance effect element, as a variable resistance element. The present embodiment and embodiments and modifications described below are based on a case in which an MTJ element is used as a variable resistance element, and the MTJ element will be expressed and described as a magnetoresistance effect element MTJ.

1.1 Configuration

1.1.1 Configuration of Memory System

Figure 1:
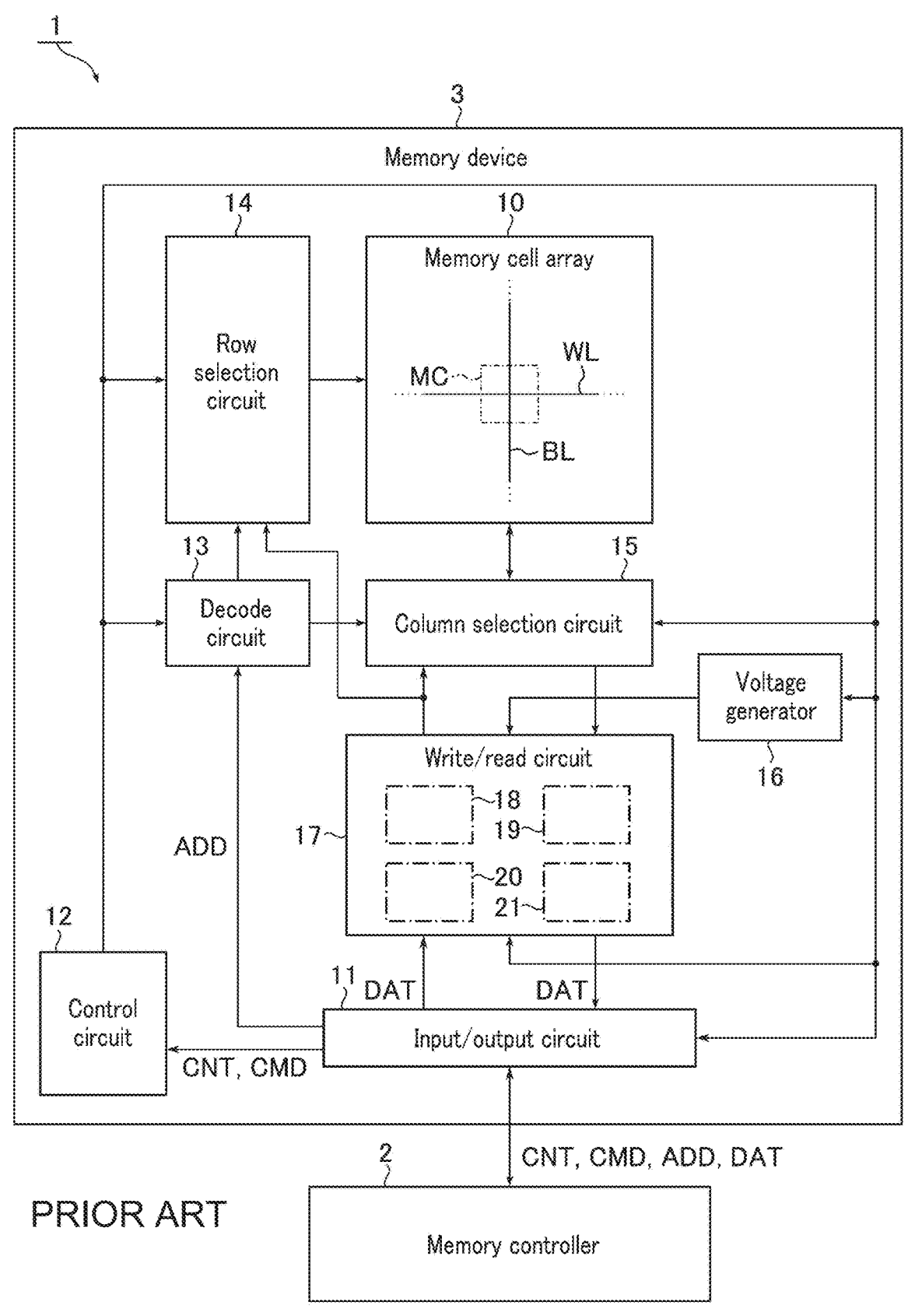
FIG. 1 is a block diagram showing an example of a configuration of a memory system including a memory device according to a first embodiment.

The configuration of a memory system including the memory device according to the first embodiment will be described with reference to FIG. 1. FIG. 1 is a block diagram showing an example of the configuration of the memory system including the memory device according to the present embodiment.

The memory system 1 is a device configured to store data. As shown in FIG. 1, the memory system 1 includes a memory controller 2 and a memory device 3.

The memory controller 2 is a device configured to control the memory device 3. The memory controller 2 is, for example, a system on a chip (SoC). The memory controller 2 is connected to a host (not shown), such as a personal computer, a server system, a mobile device, an in-vehicle device and a digital camera. The memory controller 2 receives a request signal from the host. The memory controller 2 controls the memory device 3 based on a request signal received from the host or a voluntary processing request.

The memory device 3 includes a plurality of memory cells. The memory device 3 stores data received from the memory controller 2 into the memory cells. The memory device 3 also outputs data that is read from the memory cells to the memory controller 2.

As shown in FIG. 1, the memory device 3 includes a memory cell array 10, an input/output circuit 11, a control circuit 12, a decode circuit 13, a row selection circuit 14, a column selection circuit 15, a voltage generator 16 and a write/read circuit 17.

The memory cell array 10 is a nonvolatile memory. The memory cell array 10 includes a plurality of memory cells MC each of which is associated with a pair of a row and a column. The memory cells MC store data nonvolatilely. For example, the memory cells MC arranged in the same row are connected to the same word line WL. The memory cells MC arranged in the same column are connected to the same bit line BL.

The input/output circuit 11 is a circuit configured to transmit and receive data. The input/output circuit 11 receives a control signal CNT, a command CMD, an address ADD and data (write data) DAT from the memory controller 2. The write data is data to be written to the memory cell array 10. The input/output circuit 11 transmits the control signal CNT and command CMD to the control circuit 12. The input/output circuit 11 transmits the address ADD to the decode circuit 13. The input/output circuit 11 transmits the data (write data) DAT to the write/read circuit 17. The input/output circuit 11 also receives data (read data) DAT from the write/read circuit 17. The read data DAT is data that is read from the memory cell array 10. The input/output circuit 11 transmits the data (read data) DAT to the memory controller 2.

The control circuit 12 is a circuit configured to control the entire operation of the memory device 3. Based on the control signal CNT and the command CMD, the control circuit 12 controls the operations of the input/output circuit 11, the decode circuit 13, the row selection circuit 14, the column selection circuit 15, the voltage generator 16 and the write/read circuit 17.

The decode circuit 13 is a circuit configured to decode the address ADD. The decode circuit 13 receives the address ADD from the input/output circuit 11. The decode circuit 13 decodes the address ADD. The decode circuit 13 transmits a decoding result of the address ADD to the row selection circuit 14 and the column selection circuit 15. The address ADD includes a row address and a column address.

The row selection circuit 14 is a circuit configured to select a word line WL corresponding to a row of the memory cell array 10. The row selection circuit 14 is connected to the memory cell array 10 via the word line WL. The row selection circuit 14 receives the decoding result (row address) of the address ADD from the decode circuit 13. The row selection circuit 14 selects the word line WL corresponding to the row based on the decoding result of the address ADD.

The column selection circuit 15 is a circuit configured to select a bit line BL corresponding to a column of the memory cell array 10. The column selection circuit 15 is connected to the memory cell array 10 via the bit line BL. The column selection circuit 15 receives the decoding result (column address) of the address ADD from the decode circuit 13. The column selection circuit 15 selects the bit line BL corresponding to the column based on the decoding result of the address ADD.

The voltage generator 16 is a circuit configured to generate voltages for various operations of the memory device 3 using a power supply voltage (e.g., voltage VDD) applied from outside the memory device 3. The various operations are, for example, a write operation, a read operation and an erase operation. For example, the voltage generator 16 generates a voltage for use in the write operation (hereinafter also referred to as "write voltage"). The voltage generator 16 supplies the write voltage to the write/read circuit 17. The voltage generator 16 also generates a voltage for use in the read operation (hereinafter also referred to as "read voltage"). The voltage generator 16 supplies the read voltage to the write/read circuit 17.

The write/read circuit 17 is a circuit configured to write data to the memory cells MC and read data therefrom.

The write/read circuit 17 includes a write driver 18. The write/read circuit 17 receives write data DAT from the input/output circuit 11. The write/read circuit 17 is applied with the write voltage from the voltage generator 16. The write driver 18 is, for example, a constant current driver circuit. The write driver 18 supplies a current based on the write voltage (which is used in the write operation and will also be referred to as "write current" hereinafter) to the row selection circuit 14 or the column selection circuit 15. The row selection circuit 14 supplies a write current to the memory cell array 10 via the selected word line WL. The column selection circuit 15 supplies a write current to the memory cell array 10 via the selected bit line BL.

The write/read circuit 17 also includes a read driver 19 and a sense amplifier 20. The write/read circuit 17 is applied with a read voltage from the voltage generator 16. The read driver 19 is, for example, a constant current driver circuit. The read driver 19 supplies a current based on the read voltage (which is used in the read operation and will also be referred to as "read current" hereinafter) to the column selection circuit 15. The column selection circuit 15 supplies a read current to the memory cell array 10 via the selected bit line BL. The sense amplifier 20 retrieves data stored in the memory cell MC based on the voltage of the bit line BL. The write/read circuit 17 transmits the retrieved data as read data DAT to the input/output circuit 11.

The write/read circuit 17 also includes a feedback circuit 21. The feedback circuit 21 is a circuit configured to feed back a leakage current flowing through the memory cell array 10. Details of the feedback circuit 21 will be described later.

1.1.2 Configuration of Memory Cell Array

Figure 2:
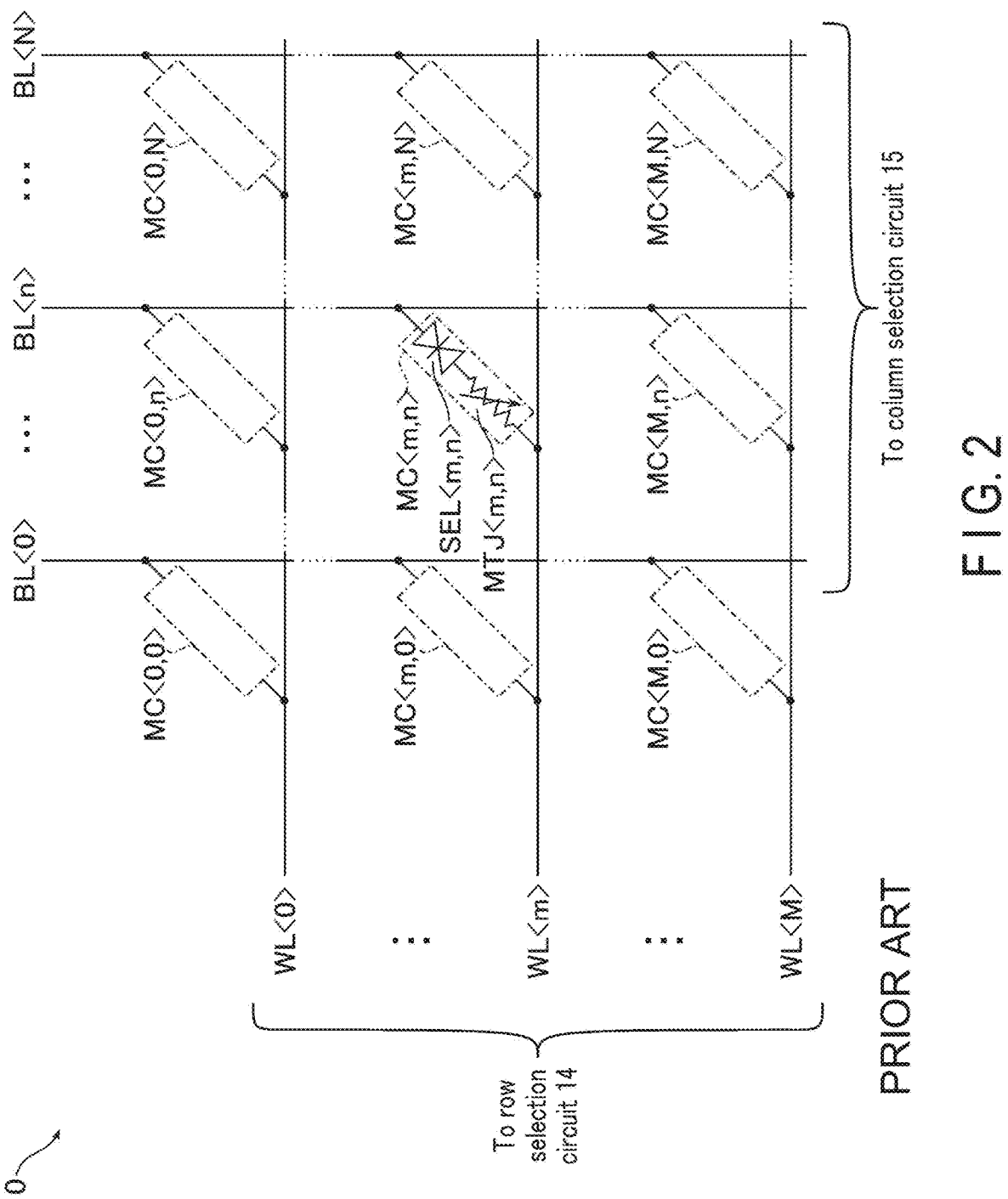
FIG. 2 is a circuit diagram showing an example of a configuration of a memory cell array included in the memory device according to the first embodiment.

The configuration of the memory cell array 10 will be described with reference to FIG. 2. FIG. 2 is a circuit diagram showing an example of the configuration of the memory cell array 10. In FIG. 2, the memory cells MC, the word lines WL and the bit lines BL are classified by subscripts each including an index ("< >").

As shown in FIG. 2, the memory cells MC are arranged in a matrix in the memory cell array 10. Each of the memory cells MC is associated with a pair including one of the word lines WL (WL<0>, . . . , WL<m>, . . . , WL<M>) and one of the bit lines BL (BL<O>, . . . , BL<n>, . . . , BL<N>) (M and N are integers equal to or greater than 1). That is, the memory cell MC<m, n>(0≤m≤M, 0≤n≤N) is connected between the word line WL<m> and the bit line BL<n>. The word line WL<m> is connected to the row selection circuit 14. The bit line BL<n> is connected to the column selection circuit 15. The memory cell MC<m, n> includes a switching element SEL<m, n> and a magnetoresistance effect element MTJ<m, n> connected in series.

The switching element SEL is a two-terminal switching element. The two-terminal switching element differs from a three-terminal switching element such as a transistor in that it does not include a third terminal. More specifically, in the case where a voltage applied to a memory cell MC is, for example, lower than a threshold voltage Vth, its corresponding switching element SEL shuts off a current as an insulator with a large resistance value (the switching element SEL is turned off). In the case where a voltage applied to a memory cell MC is equal to or higher than a threshold voltage Vth, the switching element SEL allows a current to flow therethrough as a conductor with a low resistance value (the switching element SEL is turned on). The switching element SEL switches between allowing current to flow and shutting off current depending on the magnitude of a voltage applied to the corresponding memory cell MC regardless of the polarity of a voltage applied between two terminals (regardless of the direction of the current flowing through the switching element SEL).

In the case where a memory cell MC is selected in the foregoing configuration, the switching element SEL in the selected memory cell MC is turned on. This allows current to flow through the magnetoresistance effect element MTJ in the selected memory cell MC.

The magnetoresistance effect element MTJ can switch between a low-resistance state and a high-resistance state based on the current flowing through the magnetoresistance effect element MTJ when the switching element SEL is in an ON state. The magnetoresistance effect element MTJ stores data nonvolatilely by a change in its resistance state.

1.1.3 Structure of Magnetoresistance Effect Element

Figure 3:
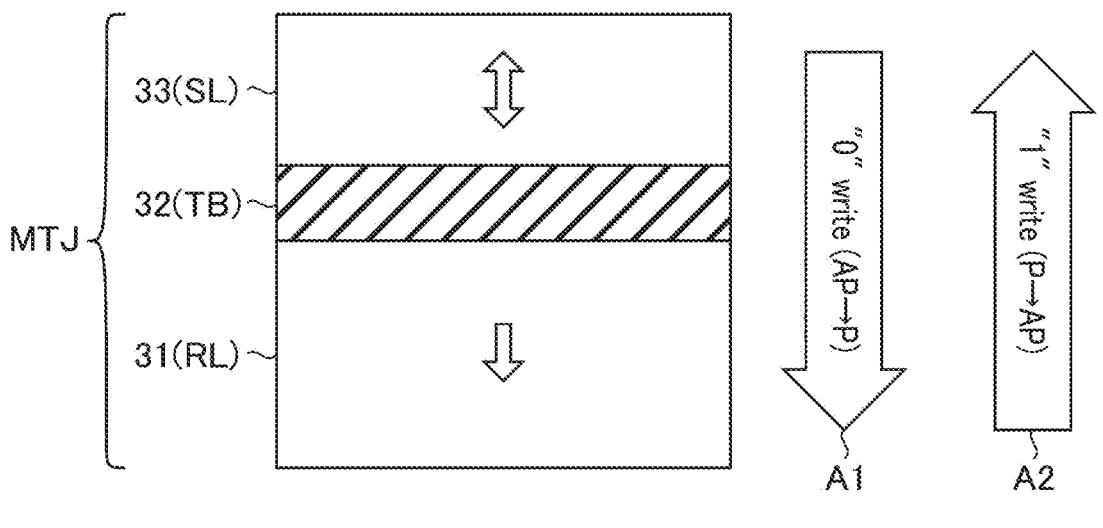
FIG. 3 is a cross-sectional view showing an example of a structure of a magnetoresistance effect element included in the memory device according to the first embodiment.

The structure of the magnetoresistance effect element MTJ will be described with reference to FIG. 3. FIG. 3 is a cross-sectional view showing an example of the structure of the magnetoresistance effect element MTJ.

As shown in FIG. 3, the magnetoresistance effect element MTJ includes a ferromagnet 31 functioning as a reference layer RL, a nonmagnet 32 functioning as a tunnel barrier layer TB, and a ferromagnet 33 functioning as a storage layer SL. The ferromagnet 31, the nonmagnet 32 and the ferromagnet 33 are stacked in the order presented above a semiconductor substrate, not shown, for example. The magnetoresistance effect element MTJ functions, for example, as a perpendicular-magnetization type magnetoresistance effect element MTJ in which the magnetization directions of magnetic materials constituting the magnetoresistance effect element MTJ are each perpendicular to a film surface.

The ferromagnet 31 has ferromagnetism, and has an easy axis of magnetization in a direction perpendicular to the film surface. The ferromagnet 31 includes, for example, cobalt-iron-boron (CoFeB) or iron boride (FeB). The magnetization direction of the ferromagnet 31 is fixed and, in FIG. 3, is directed to the surface opposite to the surface on which the nonmagnet 32 is provided. Note that "the magnetization direction is fixed" means that the magnetization direction is not varied by a current (spin torque) of the magnitude such that the magnetization direction of the ferromagnet 33 may be inverted.

The nonmagnet 32 is a nonmagnetic insulating film, and includes, for example, magnesium oxide (MgO). The nonmagnet 32 is provided between the ferromagnets 31 and 33. With this configuration, the ferromagnet 31, the nonmagnet 32 and the ferromagnet 33 constitute a magnetic tunnel junction.

The ferromagnet 33 has ferromagnetism, and has an easy axis of magnetization in a direction perpendicular to a film surface. The ferromagnet 33 includes, for example, cobalt-iron-boron (CoFeB) or iron boride (FeB), and may have a body-centered cubic (bcc) crystal structure. The magnetization direction of the ferromagnet 33 is variable.

The magnetoresistance effect element MTJ can be set in either a low-resistance state or a high-resistance state depending on whether the relative relationship between the magnetization directions of the storage layer SL and the reference layer RL is parallel or anti-parallel. The following description is directed to a case where the spin transfer torque (STT) is used as a method for varying the resistance state of the magnetoresistance effect element MTJ. In the STT, spin torque is generated by allowing a write current to flow through the magnetoresistance effect element MTJ. The generated spin torque controls the magnetization direction of the storage layer SL relative to the magnetization direction of the reference layer RL.

In the case where a write current Iw0 of a certain magnitude is caused to flow through the magnetoresistance effect element MTJ in the direction indicated by an arrow A1 in FIG. 3, that is, in a direction from the storage layer SL toward the reference layer RL, the relative relationship between the magnetization directions of the storage layer SL and the reference layer RL becomes parallel. In this parallel state, the resistance value of the magnetoresistance effect element MTJ becomes the lowest, and the magnetoresistance effect element MTJ is set to the low-resistance state. This low-resistance state is called a "parallel (P) state", and is defined as, for example, a state of data "0". Hereinafter, the operation of causing a write current to flow from the storage layer SL into the reference layer RL to set the magnetoresistance effect element MTJ in a low-resistance state, will be referred to as ""0" write."

In the case where a write current Iw1, which is larger than the write current Iw0, is caused to flow through the magnetoresistance effect element MTJ in the direction indicated by an arrow A2 in FIG. 3, that is, in a direction from the reference layer RL toward the storage layer SL, the relative relationship between the magnetization directions of the storage layer SL and the reference layer RL becomes anti-parallel. In this antiparallel state, the resistance value of the magnetoresistance effect element MTJ becomes the highest, and the magnetoresistance effect element MTJ is set to the high-resistance state. This high-resistance state is called an "anti-parallel (AP) state", and is defined as, for example, a state of data "1". Hereinafter, the operation of causing a write current to flow from the reference layer RL into the storage layer SL to set the magnetoresistance effect element MTJ in a high-resistance state, will be referred to as ""1" write."

In the case where a read current Ir0 is caused to flow through the magnetoresistance effect element MTJ, the magnetization directions of the storage layer SL and the reference layer RL do not vary. The sense amplifier 20 determines whether the resistance state of the magnetoresistance effect element MTJ is a P state or an AP state based on the voltage of the bit line BL. The sense amplifier 20 can thus read data from the memory cell MC.

Note that the way of defining data "0" and data "1" is not limited to the examples described above. For example, the P state may be defined as data "1" and the AP state may be defined as data "0."

1.1.4 Configurations of Other Circuits

The configuration of each of the row selection circuit 14, the column selection circuit 15 and the write/read circuit 17 will be described with reference to FIGS. 4 and 5. FIGS. 4 and 5 are circuit diagrams each showing an example of the configuration of each of the row selection circuit 14, the column selection circuit 15 and the write/read circuit 17. FIGS. 4 and 5 also show the memory cell array 10 as well as the row selection circuit 14, the column selection circuit 15 and the write/read circuit 17. Note that the read driver 19 is not shown. FIG. 4 shows a connection state of each of the circuits in the case of "0" write. FIG. 5 shows a connection state of each of the circuits in the case of "1" write.

In the following, for the sake of simplicity, an exemplary case in which the number of the word lines WL is seven (word lines WL< > to WL<6>), the number of the bit lines BL is seven (bit lines BL<0> to BL<6>), and the word line WL<3> and the bit line BL<3> are selected will be described. Note that the number of the word lines WL is not limited to seven or the number of the bit lines BL is not limited to seven. In FIGS. 4 and 5, the word lines WL are shown as interconnects extending in the vertical direction and the bit lines BL are shown as interconnects extending in the horizontal direction.

As shown in FIG. 4, the row selection circuit 14 includes switches GWS0 and GWS1 and a plurality of switches LWS (seven in FIG. 4). Each of the switches GWS0 and GWS1 includes a first terminal and a second terminal. Each of the switches LWS includes a first terminal, a second terminal and a third terminal.

The switch GWS0 is an element that switches between connection and disconnection between the write/read circuit 17 and the global word line GWL0. The first terminal of the switch GWS0 is connected to the write/read circuit 17 (node ND1). The second terminal of the switch GWS0 is connected to one end of the global word line GWL0. The switch GWS1 is an element that switches between connection and disconnection between the global word line GWL0 and a first ground terminal. The first terminal of the switch GWS1 is connected to the other end of the global word line GWL0. The second terminal of the switch GWS1 is connected to the first ground terminal. A voltage VSS (0 V) may be applied to the second terminal of the switch GWS1.

Each of the switches LWS is an element that switches between connection between its corresponding word line WL and the global word line GWL0 and connection between its corresponding word line WL and the global word line GWL1. The first terminal of each of the switches LWS is connected to its corresponding word line WL. That is, the first terminals of the switches LWS are connected to different word lines WL. The second terminals of the switches LWS are connected to the global word line GWL0. The third terminals of the switches LWS are connected to the global word line GWL1.

The column selection circuit 15 includes switches GBS0 and GBS1 and a plurality of switches LBS (seven in FIG. 4). Each of the switches GBS0 and GBS1 includes a first terminal and a second terminal. Each of the switches LBS includes a first terminal, a second terminal and a third terminal.

The switch GBS0 is an element that switches between connection and disconnection between the write/read circuit 17 and the global bit line GBL0. The first terminal of the switch GBS0 is connected to the write/read circuit 17 (node ND1). The second terminal of the switch GBS0 is connected to one end of the global bit line GBL0. The switch GBS1 is an element that switches between connection and disconnection between the global bit line GBL0 and a second ground terminal. The first terminal of the switch GBS1 is connected to the other end of the global bit line GBL0. The second terminal of the switch GBS1 is connected to the second ground terminal. The voltage VSS (0 V) may be applied to the second terminal of the switch GBS1.

Each of the switches LBS is an element that switches between connection between its corresponding bit line BL and the global bit line GBL0 and connection between its corresponding bit line BL and the global bit line GBL1. The first terminal of each of the switches LBS is connected to its corresponding bit line BL. That is, the first terminals of the switches LBS are connected to different bit lines BL. The second terminals of the switches LBS are connected to the global bit line GBL0. The third terminals of the switches LBS are connected to the global bit line GBL1.

Next, the configuration of the write/read circuit 17 will be described.

The write driver 18 is connectable to the word lines WL via the row selection circuit 14. The write driver 18 is connectable to the bit lines BL via the column selection circuit 15. The write driver 18 includes a current source 41 and a current detection circuit 42. The current source 41 is a circuit configured to output a constant current Iw based on a feedback value fb1. The constant current Iw is a write current (current supplied to a memory cell MC in which data is to be written). The voltage VDD is applied to the current source 41. The current source 41 is connected to the current detection circuit 42. The current detection circuit 42 detects the current output from the current source 41. The current detection circuit 42 includes an ammeter 43. Current detection is performed by ammeter 43. The current detection circuit 42 also outputs the detected current to the node ND1 and generates the feedback value fb1 based on the detected current. The feedback value fb1 may be the detected current or a signal based on the detected current. The current detection circuit 42 feeds the generated feedback value fb1 back to the current source 41. The current source 41 outputs the constant current Iw based on the feedback value fb1 received from the current detection circuit 42. The constant current Iw is supplied to the node ND1 through the current detection circuit 42. That is, the write driver 18 outputs the constant current Iw to the node ND1.

The feedback circuit 21 is connectable to the word lines WL via the row selection circuit 14. The feedback circuit 21 is connectable to the bit lines BL via the column selection circuit 15. The feedback circuit 21 includes a switch FSW, a current source 51 and current detection circuits 52 and 54. The switch FSW includes a first terminal, a second terminal and a third terminal.

The switch FSW is an element that switches between connection between the current source 51 and the current detection circuit 52 and connection between the current source 51 and the current detection circuit 54. The first terminal of the switch FSW is connected to the current source 51. The second terminal of the switch FSW is connected to the current detection circuit 52. The third terminal of the switch FSW is connected to the current detection circuit 54.

The current source 51 is a circuit configured to output a feedback current (referred to as "current Ifb" hereinafter) based on a feedback value fb2 or a feedback value fb3. The voltage VDD is applied to the current source 51. The current source 51 is connected to a node ND2.

The current detection circuit 52 detects a leakage current flowing from the memory cell array 10 to the global bit line GBL1 or a leakage current flowing from the global bit line GBL1 to the global word line GWL0 through the memory cell array 10. A voltage Vusel is applied to the current detection circuit 52. The voltage Vusel is higher than the voltage VSS and lower than the voltage VDD. The voltage Vusel is, for example, a voltage that turns off the switching element SEL. That is, the voltage Vusel is lower than the threshold voltage Vth of the switching element SEL. The current detection circuit 52 is connected to the global bit line GBL1 and the switch FSW. The current detection circuit 52 includes an ammeter 53. The voltage Vusel is applied to one end of the ammeter 53. The other end of the ammeter 53 is connected to the global bit line GBL1. Current detection is performed by ammeter 53. The current detection circuit 52 also generates the feedback value fb2 based on the detected current. The feedback value fb2 may be the detected current or a signal based on the detected current. The current detection circuit 52 feeds the generated feedback value fb2 back to the current source 51 via the switch FSW.

The current detection circuit 54 detects a leakage current flowing from the memory cell array 10 to the global word line GWL1 or a leakage current flowing from the global word line GWL1 to the global bit line GBL0 through the memory cell array 10. The voltage Vusel is applied to the current detection circuit 54. The current detection circuit 54 is connected to the global word line GWL1 and the switch FSW. The current detection circuit 54 includes an ammeter 55. The voltage Vusel is applied to one end of the ammeter 55. The other end of the ammeter 55 is connected to the global word line GWL1. Current detection is performed by ammeter 55. The current detection circuit 54 also generates the feedback value fb3 based on the detected current. The feedback value fb3 can be the detected current or a signal based on the detected current. The current detection circuit 54 feeds the generated feedback value fb3 back to the current source 51 via the switch FSW.

The current source 51 outputs the feedback current Ifb based on the feedback value fb2 or fb3. The feedback current Ifb is supplied to the node ND2. That is, the feedback circuit 21 outputs the feedback current Ifb to the node ND1.

As shown in FIG. 4, in the case of "0" write, in the row selection circuit 14, the switch GWS0 is turned on (connected). The switch GWS1 is turned off (disconnected). The word line WL (word line WL<3>) connected to the global word line GWL0 via the switch LWS is a selected word line WL. The word lines WL (word lines WL<0> to WL<2> and WL<4> to WL<6>), which are connected to the global word line GWL1 via the switch LWS, are non-selected word lines WL.

In the column selection circuit 15, the switch GBS0 is turned off. The switch GBS1 is turned on. The bit line BL (bit line BL<3>) connected to the global bit line GBL0 via the switch LBS is a selected bit line BL. The bit lines BL (bit lines BL<0> to BL<2> and BL<4> to BL<6>), which are connected to the global bit line GBL1 via the switch LBS, are non-selected bit lines BL.

The memory cell MC (memory cell MC<3, 3> that is circled), one end of which is connected to the selected word line WL and the other end of which is connected to the selected bit line BL, is a selected memory cell MC. The other memory cells MC are non-selected memory cells MC.

The sum (Iw+Ifb) of the constant current Iw output from the write driver 18 and the feedback current Ifb output from the feedback circuit 21 is supplied from the write/read circuit 17 to the row selection circuit 14.

On the other hand, as shown in FIG. 5, in the case of "1" write, in the row selection circuit 14, the switch GWS0 is turned off. The switch GWS1 is turned on. The selected word line WL and the non-selected word lines WL are similar to those in FIG. 4. In the column selection circuit 15, the switch GBS0 is turned on. The switch GBS1 is turned off. The selected bit line BL and the non-selected bit lines BL are similar to those in FIG. 4. The selected memory cell MC and the non-selected memory cells MC are similar to those in FIG. 4. The current Iw+Ifb is supplied from the write/read circuit 17 to the column selection circuit 15.

1.2 Write Operation

The write operation will be described. First, the write operation in the case of "0" write will be described with reference to FIG. 6. FIG. 6 is a diagram illustrating the write operation in the case of "0" write.

The write driver 18 outputs the constant current Iw to the node ND1. The feedback circuit 21 outputs the feedback current Ifb to the node ND1. The write/read circuit 17 supplies the current Iw+Ifb to the row selection circuit 14.

The row selection circuit 14 supplies the current Iw+Ifb to the selected word line WL (word line WL<3>), for example. Hereinafter, the connection node between the selected word line WL and the global word line GWL0 will be referred to as "node ND3." The voltage of the node ND3 will be referred to as "voltage Vapp1." The column selection circuit 15 applies the voltage VSS to the selected bit line BL (bit line BL<3>), for example. Hereinafter, the connection node between the selected bit line BL and the global bit line GBL0 will be referred to as "node ND4." The voltage of the node ND4 will be referred to as "voltage Vapp2."

The row selection circuit 14 also applies the voltage Vusel to the non-selected word lines WL (word lines WL<0> to WL<2> and WL<4> to WL<6>), for example. The column selection circuit 15 also applies the voltage Vusel to the non-selected bit lines BL (bit lines BL<0> to BL<2> and BL<4> to BL<6>), for example.

In the case where the interconnect resistance of the word lines WL and the bit lines BL is ignored, a potential difference (Vapp1) between the voltage Vapp1 and the voltage Vapp2 (voltage VSS) occurs in the selected memory cell MC (memory cell MC<3, 3>). In the case where the potential difference becomes equal to or higher than the threshold voltage Vth, a current flows from the selected word line WL to the selected memory cell MC. Hereinafter, the current flowing through the selected memory cell MC will be referred to as "current Icell." The current Icell flows from the selected memory cell MC to the second ground terminal through the selected bit line BL and the column selection circuit 15.

For example, a potential difference between the voltage Vapp1 and the voltage Vusel occurs in the non-selected memory cells MC (memory cells MC<3,0> to MC<3,2> and MC<3, 4> to MC<3,6>) among the memory cells MC connected to the selected word line WL. These non-selected memory cells are specifically called half-selected memory cells. Although the potential difference is controlled below the threshold voltage Vth, a minute leakage current (hereinafter referred to as "current Ilkb") flows from the selected word line WL to each of the half-selected memory cells MC. The leakage current Ilkb flows to the current detection circuit 52 through each of the non-selected bit lines BL and the column selection circuit 15. Hereinafter, the sum (ΣIlkb) of leakage currents Ilkb flowing through the half-selected memory cells MC will be referred to as "current IleakBL." The leakage current IleakBL flows through the current detection circuit 52.

For example, a potential difference between the voltage Vusel and the voltage VSS occurs in the half-selected memory cells MC (memory cells MC<0, 3> to MC<2, 3> and MC<4, 3> to MC<6, 3>) among the memory cells MC connected to the selected bit line BL. Although the potential difference is controlled below the threshold voltage Vth, a minute leakage current (hereinafter referred to as "current Ilkw") flows from the current detection circuit 54 to each of the half-selected memory cells MC through each of the non-selected word lines WL. The leakage current Ilkw flows to the second ground terminal through the selected bit line BL and the column selection circuit 15. Hereinafter, the sum (ΣIlkw) of leakage currents Ilkw flowing through the half-selected memory cells MC will be referred to as "current IleakWL." The current Icell+IleakWL flows to the second ground terminal.

No potential difference occurs in the non-selected memory cell MC connected to the non-selected word line WL and non-selected bit line BL.

The current detection circuit 52 detects the leakage current IleakBL and generates the feedback value fb2 based on the detected current. The current detection circuit 52 feeds the generated feedback value fb2 back to the current source 51. The current source 51 outputs the feedback current Ifb based on the feedback value fb2. The feedback current Ifb is based on the leakage current IleakBL flowing through the non-selected bit lines BL (half-selected memory cell MCs one end of each of which is connected to the selected word line WL and the other end of each of which is connected to each of the non-selected bit lines BL). The feedback current Ifb is equal to, for example, the current detected by the current detection circuit 52, i.e., the current IleakBL.

In practice, the interconnect resistance of the word lines WL and the bit lines BL may not be ignored. In the case where the interconnect resistance of the word lines WL and the bit lines BL cannot be ignored, the voltage Vapp1 of the node ND3 is expressed by the following equation using a potential difference Vcell applied to the selected memory cell MC:

$$Vapp1 = Vcell + Vdw1 + Vdb1$$

$$= Icell \times Rmtj + Vdw1 + Vdb1$$

where Vdw1 and Vdb1 are the amounts of voltage drop caused by the word line WL<m> and the bit line BL<n>, respectively. Rmtj is the resistance of the memory cell MC (magnetoresistance effect element MTJ). That is, the voltage Vapp1 is equal to a voltage obtained by adding the amounts of voltage drop caused by the word line WL<m> and the bit line BL<n> to the potential difference Vcell.

(Waveforms of Various Voltages and Currents During Write Operation)

Figure 7:
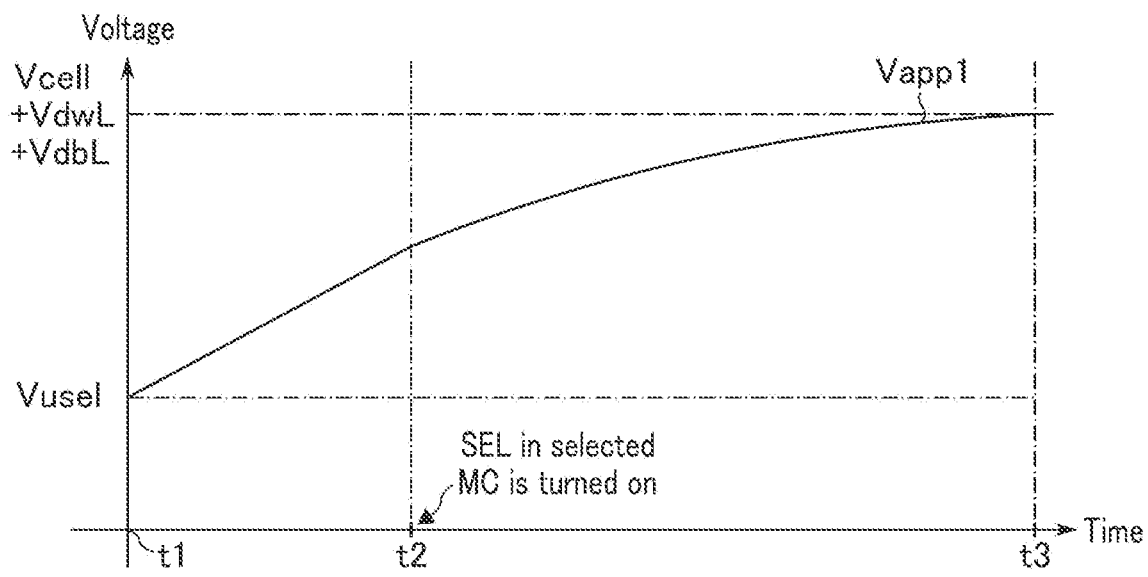
FIG. 7 is a graph showing a voltage waveform during a write operation of the memory device according to the first embodiment.
Figure 8:
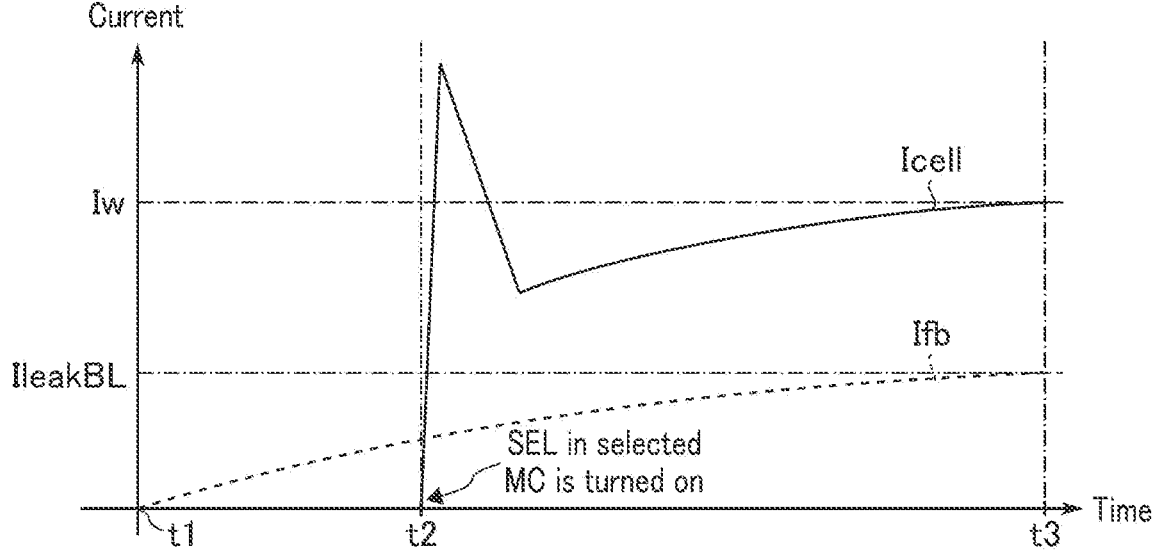
FIG. 8 is a graph showing a current waveform during a write operation of the memory device according to the first embodiment.

The waveforms of various voltages and currents during the write operation will be described with reference to FIGS. 7 and 8. FIG. 7 is a graph showing the waveform of voltage Vapp1 during the write operation in the case of "0" write. FIG. 8 is a graph showing the waveforms of currents Icell and Ifb during the write operation in the case of "0" write.

Assume that at time t1, the voltage Vapp1 at the node ND3 is the voltage Vusel. In the case where the current Iw+Ifb is supplied to the row selection circuit 14, the voltage Vapp1 rises. No current flows through the selected memory cell MC until the potential difference Vcell applied to the selected memory cell MC becomes equal to or higher than the threshold voltage Vth.

As described above, the potential difference between the voltage Vapp1 and the voltage Vusel is controlled to be less than the threshold voltage Vth. Thus, the half-selected memory cells MC connected to the selected word line WL are not turned on. However, a minute leakage current Ilkb flows through each of the half-selected memory cells MC connected to the selected word line WL. The sum (ΣIlkb) of leakage currents Ilkb from all the half-selected cells MC connected to the selected word line WL is an ignorable value. The current detection circuit 52 detects the sum (ΣIlkb) of leakage currents Ilkb and generates the feedback value fb2 based on the detected current. In the case where the current detection circuit 52 feeds the feedback value fb2 back to the current source 51, the feedback current Ifb output from the current source 51 rises. In the case where the feedback current Ifb rises, the current Iw+Ifb supplied to the row selection circuit 14 rises. Accordingly, the voltage Vapp1 rises and so does the current Ilkb.

At time t2, in the case where the potential difference Vcell applied to the selected memory cell MC becomes equal to or higher than the threshold voltage Vth, the switching element SEL in the selected memory cell MC is turned on. Then, the resistance value of the switching element SEL in the selected memory cell MC drops rapidly to cause current to flow easily, with the result that a current Icell larger than the constant current Iw flows momentarily through the selected memory cell MC due to the charged electrons. In the case where a change in the resistance value of the switching element SEL in the selected memory cell MC settles, the current Icell lowers. Since the current Iw+Ifb is supplied to the row selection circuit 14, the voltage Vapp1 rises. This also increases the current Icell.

At time t3, in the case where the current Icell becomes the constant current Iw, the current Ifb becomes the current IleakBL and the voltage Vapp1 becomes voltage Vcell+Vdw1+Vdb1. Thus, the selected memory cell MC is supplied with the constant current Iw as the current Icell regardless of the amount of voltage drop caused by the word line WL<m> and the bit line BL<n>.

The write operation in the case of "1" write will be described with reference to FIG. 9. FIG. 9 is a diagram illustrating the write operation in the case of "1" write.

The write driver 18 outputs the constant current Iw to the node ND1. The feedback circuit 21 outputs the feedback current Ifb to the node ND1. The write/read circuit 17 supplies the current Iw+Ifb to the column selection circuit 15.

The column selection circuit 15 supplies the current Iw+Ifb to the selected bit line BL (bit line BL<3>), for example. The row selection circuit 14 applies the voltage VSS to the selected word line WL (word line WL<3>), for example.

The column selection circuit 15 also applies the voltage Vusel to the non-selected bit lines BL (bit lines BL<0> to BL<2> and BL<4> to BL<6>), for example. The row selection circuit 14 also applies the voltage Vusel to the non-selected word lines WL (word lines WL<0> to WL<2> and WL<4> to WL<6>), for example.

In the case where the interconnect resistance of the word lines WL and the bit lines BL is ignored, a potential difference (Vapp2) between the voltage Vapp2 and the voltage Vapp1 (voltage VSS) occurs in the selected memory cell MC (memory cell MC<3, 3>) as in the "0" write. In the case where the potential difference becomes equal to or higher than the threshold voltage Vth, the current Icell flows from the selected bit line BL to the selected memory cell MC. The current Icell flows from the selected memory cell MC to the first ground terminal through the selected word line WL and the row selection circuit 14.

For example, a potential difference between the voltage Vapp2 and the voltage Vusel occurs in the half-selected memory cells MC (memory cells MC<0,3> to MC<2, 3> and MC<4, 3> to MC<6,3>) among the memory cells MC connected to the selected bit line BL. Although the potential difference is controlled below the threshold voltage Vth, a minute leakage current Ilkw flows from the selected bit line BL to each of the half-selected memory cells MC. The leakage current Ilkw flows to the current detection circuit 54 through each of the non-selected word lines WL and the row selection circuit 14. The leakage current IleakWL (ΣIlkw) flows through the current detection circuit 54.

For example, a potential difference between the voltage Vusel and the voltage VSS occurs in the half-selected memory cells MC (memory cells MC<3,0> to MC<3,2> and MC<3,4> to MC<3,6>) among the memory cells MC connected to the selected word line WL. Although the potential difference is controlled below the threshold voltage Vth, a minute leakage current Ilkb flows from the current detection circuit 52 to each of the half-selected memory cells MC through each of the non-selected bit lines BL. The leakage current Ilkb flows to the first ground terminal through the selected word line WL and the row selection circuit 14. The current Icell+IleakBL (ΣIlkb) flows to the first ground terminal.

No potential difference occurs in the non-selected memory cell MC connected to the non-selected word line WL and non-selected bit line BL.

The current detection circuit 54 detects the leakage current IleakWL and generates the feedback value fb3 based on the detected current. The current detection circuit 54 feeds the generated feedback value fb3 back to the current source 51. The current source 51 outputs the feedback current Ifb based on the feedback value fb3. The feedback current Ifb is based on the leakage current IleakWL flowing through the non-selected word lines WL (half-selected memory cells MC one end of each of which is connected to the selected bit line BL and the other end of each of which is connected to each of the non-selected word lines WL). The feedback current Ifb is equal to, for example, the current detected by the current detection circuit 54, i.e., the current IleakWL.

In the case where the interconnect resistance of the word lines WL and the bit lines BL cannot be ignored, the voltage Vapp2 of the node ND4 is expressed by the following equation using the potential difference Vcell applied to the selected memory cell MC as in the "0" write:

$$Vapp2 = Vcell + Vdw1 + Vdb1$$
$$= Icell \times Rmtj + Vdw1 + Vdb1$$

That is, the voltage Vapp2 is equal to a voltage obtained by adding the amounts of voltage drop caused by the word line WL<m> and the bit line BL<n> to the potential difference Vcell.

(Waveforms of Various Voltages and Currents During Write Operation)

The waveforms of various voltages and currents during the write operation in the case of "1" write are the same as those in the case of "0" write, except that the voltage Vapp1 in FIG. 7 is replaced by the voltage Vapp2 and the current IleakBL in FIG. 8 is replaced by the current IleakWL.

1.3 Advantageous Effect of First Embodiment

According to the first embodiment, a constant current can be supplied to a memory cell MC regardless of the address of the memory cell MC. This advantageous effect will be described below.

In the case where the write driver 18 supplies a write current Iw to a selected word line WL via the row selection circuit 14, a leakage current Ilkb flows through each of the half-selected memory cells MC connected to the selected word line WL. Thus, the current Icell flowing through the selected memory cell MC becomes equal to a difference (Iw-IleakBL) between the current Iw and the sum (IleakBL) of the leakage currents Ilkb. That is, the current Icell becomes lower than the current Iw. The same is true of the case where the write driver 18 supplies the write current Iw to the selected bit line BL via the column selection circuit 15.

The sum of leakage currents varies depending on the address of the selected memory cell MC.

Therefore, in the case where a constant current is caused to flow through a selected memory cell MC, it is considered that the constant current is caused to flow through the selected memory cell MC by setting the write current Iw supplied from the write driver 18 to a value for which the sum of the leakage currents is considered for each address. In this case, however, for example, a table in which the addresses of memory cells MC and the values of currents supplied to the memory cells MC are caused to correspond to each other, needs to be prepared. As the number of memory cells MC increases, the size of the memory device 3 may increase.

In contrast, according to the first embodiment, the write/read circuit 17 includes the write driver 18 and the feedback circuit 21.

The write driver 18 outputs the write current Iw (constant current).

The feedback circuit 21 includes the switch FSW, the current source 51 and the current detection circuits 52 and 54.

The current detection circuit 52 detects the sum (IleakBL) of leakage currents Ilkb that flow from the selected word line WL to each of the half-selected memory cells MC. The current detection circuit 52 also generates a feedback value fb2 based on the detected current. The current detection circuit 52 feeds the generated feedback value fb2 back to the current source 51 via the switch FSW.

The current detection circuit 54 detects the sum (IleakWL) of leakage currents Ilkw that flow from the selected bit line BL to each of the half-selected memory cells MC. The current detection circuit 54 also generates a feedback value fb3 based on the detected current. The current detection circuit 54 feeds the generated feedback value fb3 back to the current source 51 via the switch FSW.

The current source 51 outputs a feedback current Ifb based on the feedback value fb2 or fb3. That is, the feedback circuit 21 outputs the feedback current Ifb. The feedback current Ifb is, for example, a current (IleakBL) detected by the current detection circuit 52 or a current (IleakWL) detected by the current detection circuit 54.

The write/read circuit 17 supplies the sum (Iw+Ifb) of the write current Iw and the feedback current Ifb to the row selection circuit 14 or the column selection circuit 15. Accordingly, the sum of the write current Iw and the current Ifb corresponding to the leakage current IleakBL is supplied to the selected word line WL through the row selection circuit 14. Therefore, the current Icell flowing through the selected memory cell MC becomes equal to a difference (Iw) between the current Iw+Ifb and the leakage current IleakBL. That is, the current Icell is equal to the current Iw. The same is true of the case where the current Iw+Ifb is supplied to the selected bit line BL through the column selection circuit 15. Therefore, according to the first embodiment, the constant current Iw can be supplied to a memory cell MC regardless of the address of the memory cell MC.

1.4 Modification

A memory device according to a modification of the first embodiment will be described. In the memory device according to the modification of the first embodiment, the feedback circuit 21 differs in configuration from that of the first embodiment. In the following description, points different from those of the first embodiment will mainly be described.

1.4.1 Configuration of Feedback Circuit

The configuration of the feedback circuit 21 will be described with reference to FIGS. 10 and 11. FIGS. 10 and 11 are circuit diagrams each showing an example of the configuration of the feedback circuit 21. FIGS. 10 and 11 also show the write driver 18 and the memory cell array 10 as well as the feedback circuit 21. In addition, FIG. 10 shows a connection state of each circuit in the case of "0" write. FIG. 11 shows a connection state of each circuit in the case of "1" write.

As shown in FIG. 10, the feedback circuit 21 includes a switch FSW, pnp bipolar transistors T51 and T52 and npn bipolar transistors T53 to T56.

The switch FSW has a configuration similar to that of the switch FSW shown in the first embodiment. The first terminal of the switch FSW is connected to a node ND6. The second terminal of the switch FSW is connected to a collector of the transistor T54. The third terminal of the switch FSW is connected to a collector of the transistor T56.

The voltage VDD is applied to an emitter of the transistor T51. A collector of the transistor T51 is connected to the node ND6. A base of the transistor T51 is connected to a node ND5 and the node ND6. The voltage VDD is applied to an emitter of the transistor T52. A collector of the transistor T52 is connected to the node ND1. A base of the transistor T52 is connected to the node ND5. The transistors T51 and T52 constitute a current mirror circuit.

The voltage Vusel is applied to an emitter of the transistor T53. A collector of the transistor T53 is connected to a node ND8. A base of the transistor T53 is connected to a node ND7 and the node ND8. The voltage Vusel is applied to an emitter of the transistor T54. A base of the transistor T54 is connected to the node ND7. The transistors T53 and T54 constitute a current mirror circuit.

The voltage Vusel is applied to an emitter of the transistor T55. A collector of the transistor T55 is connected to a node ND10. A base of the transistor T55 is connected to a node ND9 and the node ND10. The voltage Vusel is applied to an emitter of the transistor T56. The base of the transistor T56 is connected to the node ND9. The transistors T55 and T56 constitute a current mirror circuit.

As shown in FIG. 10, in the case of "0" write, the switch FSW connects the collector of the transistor T51 and the collector of the transistor T54. The leakage current IleakBL flowing from the memory cell array 10 to the global bit line GBL1 flows to the transistor T53 through the node ND8. Accordingly, the current IleakBL flows through the transistor T54. The current IleakBL also flows through the transistor T51. Accordingly, the current IleakBL flows through the transistor T52. The feedback circuit 21 outputs the current IleakBL to the node ND1 as the feedback current Ifb.

As shown in FIG. 11, in the case of "1" write, the switch FSW connects the collector of the transistor T51 and the collector of the transistor T56. The leakage current IleakWL flowing from the memory cell array 10 to the global word line GWL1 flows to the transistor T55 through the node ND10. Accordingly, the current IleakWL flows through the transistor T56. The current IleakWL also flows through the transistor T51. Accordingly, the current IleakWL flows through the transistor T52. The feedback circuit 21 outputs the current IleakWL to the node ND1 as the feedback current Ifb.

1.4.2 Advantageous Effect of Modification

In the modification, the feedback circuit 21 outputs, as the feedback current Ifb, the sum (IleakBL) of leakage currents Ilkb flowing from the selected word line WL to each of the half-selected memory cells MC or the sum (IleakWL) of leakage currents Ilkw flowing from the selected bit line BL to each of the half-selected memory cells MC. Therefore, the modification brings about an advantageous effect similar to that of the first embodiment.

2. Second Embodiment

A memory device according to a second embodiment will be described. In the memory device according to the second embodiment, the write/read circuit 17 differs in configuration from that of the first embodiment. In the following description, points different from those of the first embodiment will mainly be described.

2.1 Configuration of Write/Read Circuit

The configuration of the write/read circuit 17 will be described with reference to FIG. 12. FIG. 12 is a circuit diagram showing an example of the configuration of the write/read circuit 17. FIG. 12 also shows the memory cell array 10, the row selection circuit 14 and the column selection circuit 15 as well as the write/read circuit 17. Note that the write driver 18 is not shown.

The read driver 19 includes a current source 61 and a current detection circuit 62. The current source 61 is a circuit configured to output a constant current Ir based on a feedback value fb4. The constant current Ir is a read current (current supplied to a memory cell MC from which data is to be read). The voltage VDD is applied to the current source 61. The current source 61 is connected to the current detection circuit 62. The current detection circuit 62 detects the current output from the current source 61. The current detection circuit 62 includes an ammeter 63. Current detection is performed by ammeter 63. The current detection circuit 62 outputs the detected current to the node ND1 and generates the feedback value fb4 based on the detected current. The feedback value fb4 may be the detected current or a signal based on the detected current. The current detection circuit 62 feeds the generated feedback value fb4 back to the current source 61. The current source 61 outputs the constant current Ir based on the feedback value fb4 received from the current detection circuit 62. The constant current Ir is supplied to the node ND1 through the current detection circuit 62. That is, the read driver 19 outputs the constant current Ir to the node ND1.

The current detection circuit 52 generates a feedback value fb5 based on the current detected by the ammeter 53 in addition to the process shown in the first embodiment. The feedback value fb5 may be the detected current, a value (voltage value) obtained by converting the detected current into a voltage or a signal based on the detected current. The current detection circuit 52 further feeds the generated feedback value fb5 back to a reference voltage generator 72.

The current detection circuit 54 generates a feedback value fb6 based on the current detected by the ammeter 55 in addition to the process shown in the first embodiment. The feedback value fb6 may be the detected current, a value (voltage value) obtained by converting the detected current into a voltage or a signal based on the detected current. The current detection circuit 54 further feeds the generated feedback value fb6 back to the reference voltage generator 72.

The sense amplifier 20 is connectable to the bit lines BL via the column selection circuit 15. The sense amplifier 20 includes a comparator 71 and the reference voltage generator 72.

The comparator 71 is a circuit configured to compare a voltage of the selected bit line BL (referred to as "voltage VBL" hereinafter) with a reference voltage (referred to as "voltage Vref" hereinafter). The comparator 71 is connected to the selected bit line BL and the reference voltage generator 72.

The reference voltage generator 72 is a circuit configured to generate the reference voltage Vref based on the feedback values fb5 and fb6. The reference voltage generator 72 is connected to the current detection circuits 52 and 54. The reference voltage generator 72 supplies the generated reference voltage Vref to the comparator 71.

The sense amplifier 20 determines the data stored in the memory cells MC based on the comparison result of the comparator 71.

2.2 Read Operation

The read operation will be described with reference to FIG. 13. FIG. 13 is a diagram illustrating the read operation.

The read driver 19 outputs the constant current Ir to the node ND1. The feedback circuit 21 outputs the feedback current Ifb to the node ND1. The write/read circuit 17 supplies the current Ir+Ifb to the column selection circuit 15.

The column selection circuit 15 supplies the current Ir+Ifb to the selected bit line BL (bit line BL<3>), for example. The row selection circuit 14 applies the voltage VSS to the selected word line WL (word line WL<3>), for example.

The column selection circuit 15 also applies the voltage Vusel to the non-selected bit lines BL (bit lines BL<0> to BL<2> and BL<4> to BL<6>), for example. The row selection circuit 14 applies the voltage Vusel to the non-selected word lines WL (word lines WL<0> to WL<2> and WL<4> to WL<6>), for example.

In the case where the potential difference Vcell applied to the selected memory cell MC becomes equal to or higher than the threshold voltage Vth as in the case of "1" write shown in the first embodiment, the current Icell flows from the selected bit line BL to the selected memory cell MC. The current Icell flows from the selected memory cell MC to the first ground terminal through the selected word line WL and the row selection circuit 14.

Although a potential difference applied to a plurality of half-selected memory cells MC among a plurality of memory cells MC connected to the selected bit line BL is controlled below the threshold voltage Vth, a minute leakage current Ilkw flows from the selected bit line BL to each of the half-selected memory cells MC. The leakage current Ilkw flows to the current detection circuit 54 through each of the non-selected word lines WL and the row selection circuit 14. The leakage current IleakWL ($\Sigma$Ilkw) flows through the current detection circuit 54.

Although a potential difference applied to a plurality of half-selected memory cells MC among a plurality of memory cells MC connected to the selected word line WL is controlled below the threshold voltage Vth, a minute leakage current Ilkb flows from the current detection circuit 52 to each of the half-selected memory cells MC through each of the non-selected bit lines BL. The leakage current Ilkb flows to the first ground terminal through the selected word line WL and the row selection circuit 14. The leakage current Icell+IleakBL ($\Sigma$Ilkb) flows to the first ground terminal.

As in the first embodiment, the current detection circuit 54 generates the feedback value fb3 based on the leakage current IleakWL and feeds the generated feedback value fb3 back to the current source 51. The current source 51 outputs the feedback current Ifb based on the feedback value fb3. The feedback current Ifb is based on the leakage current IleakWL that flows through the non-selected word lines WL (the half-selected memory cells MC one end of each of which is connected to the selected bit line BL and the other end of each of which is connected to each of the non-selected word lines WL). The feedback current Ifb is equal to, for example, the current detected by the current detection circuit 54, i.e., the current IleakWL.

The current detection circuit 52 generates the feedback value fb5 based on the detected leakage current IleakBL in addition to the process shown in the first embodiment. The current detection circuit 52 further feeds the generated feedback value fb5 back to the reference voltage generator 72.

The current detection circuit 54 generates the feedback value fb6 based on the detected leakage current IleakWL in addition to the process shown in the first embodiment. The current detection circuit 54 further feeds the generated feedback value fb6 back to the reference voltage generator 72.

In the case where the interconnect resistance of the word lines WL and the bit lines BL cannot be ignored, as in the case of "1" write shown in the first embodiment, the voltage Vapp2, that is, the voltage VBL of the selected bit line BL, becomes equal to a voltage obtained by adding the amount of drop of voltages (Vdwl and Vdbl) caused by the word line WL<m> and the bit line BL<n> to the potential difference Vcell applied to the selected memory cell MC.

Assume here that the reference voltage used in the case where the interconnect resistance of the word lines WL and the bit lines BL is ignored is referred to as "voltage Vref." In the case where the comparator 71 compares the voltage (Vcell+Vdwl+Vdbl) of the selected bit line BL with the reference voltage Vref, the sense amplifier 20 may determine the data stored in the memory cell MC wrongly.

To enable the comparator 71 to compare the potential difference Vcell and the reference voltage Vref, the reference voltage generator 72 generates a voltage obtained by adding the amount of drop of voltages (Vdwl and Vdbl) caused by the word line WL<m> and the bit line BL<n> to the reference voltage Vref. For example, the reference voltage generator 72 generates the voltage Vdbl based on the feedback value fb5. The reference voltage generator 72 generates the voltage Vdwl based on the feedback value fb6. The reference voltage generator 72 generates a voltage (Vref+Vdwl+Vdbl) which is obtained by adding the voltage Vdwl and the voltage Vdbl to the reference voltage Vref. The reference voltage generator 72 supplies the generated voltage Vref+Vdbl+Vdwl to the comparator 71 as the reference voltage Vref'.

The interconnect resistance of the word line WL connected to the row selection circuit 14 is dominated by the interconnect resistance in the memory cell array 10. Thus, Vdwl can be approximated using the leakage current IleakBL, as follows:

*Vdwl~IleakBL×Rwl*

Rwl represents the interconnect resistance of the selected word line WL from one end (position Pw1) of the memory cell array 10 to the other end (position Pw2) thereof. In other words, Vdwl can be regarded as a value that correlates with IleakBL×Rwl. Thus, the reference voltage generator 72 generates IleakBL×Rwl as the voltage Vdwl, for example.

The interconnect resistance of the bit line BL connected to the column selection circuit 15 is dominated by the interconnect resistance in the memory cell array 10. Thus, Vdbl can be approximated using the leakage current IleakWL, as follows:

*Vdbl~IleakWL×Rbl*

Rbl represents the interconnect resistance of the selected bit line BL from one end (position Pb1) of the memory cell array 10 to the other end (position Pb2) thereof. In other words, Vdbl can be regarded as a value that correlates with IleakWL×Rbl. Thus, the reference voltage generator 72 generates IleakWL×Rbl as the voltage Vdbl, for example.

In the case where Vdwl and Vdbl are approximated as described above, the reference voltage generator 72 generates a voltage Vref+IleakBL×Rwl+IleakWL×Rbl as the reference voltage Vref', for example.

The comparator 71 compares the voltage VBL (Vcell+Vdwl+Vdbl) of the selected bit line BL and the reference voltage Vref' (Vref+Vdbl+Vdwl) generated by the reference voltage generator 72.

The sense amplifier 20 determines the data stored in the memory cell MC based on the comparison result of the comparator 71. That is, the sense amplifier 20 determines the data stored in the memory cell MC based on the voltage VBL and the reference voltage Vref' based on the leakage currents IleakWL and IleakBL. In other words, the sense amplifier 20 determines the data stored in the memory cell MC based on the voltage VBL and the reference voltage Vref' based on the feedback values fb5 and fb6.

2.3 Advantageous Effect of Second Embodiment

Like the write driver 18 shown in the first embodiment, in the second embodiment, the read driver 19 outputs the read current Ir (constant current). As in the first embodiment, the feedback circuit 21 outputs the feedback current Ifb. The write/read circuit 17 supplies the column selection circuit 15 with the sum of the read current Ir and the feedback current Ifb (Ir+Ifb). Accordingly, the selected memory cell MC is supplied with the constant current Ir as the current Icell regardless of the amount of voltage drop caused by the word line WL<m> and the bit line BL<n>. Therefore, the second embodiment brings about the same advantageous effect as that of the first embodiment.

Also, in the second embodiment, the current detection circuit 52 generates the feedback value fb5 based on the detected leakage current IleakBL. The current detection circuit 52 feeds the generated feedback value fb5 back to the reference voltage generator 72.

The current detection circuit 54 generates the feedback value fb6 based on the detected leakage current IleakWL. The current detection circuit 54 feeds the generated feedback value fb6 back to the reference voltage generator 72.

As described above, in the case where the interconnect resistance of the word lines WL and the bit lines BL cannot be ignored, the voltage Vapp2 of the node ND4, that is, the voltage of the selected bit line BL, is a voltage obtained by adding the amount of drop of voltages (Vdwl and Vdbl) caused by the word line WL<m> and the bit line BL<n> to the potential difference Vcell applied to the selected memory cell MC.

To enable the comparator 71 to compare the potential difference Vcell and the reference voltage Vref, the reference voltage generator 72 generates the voltage (Vref+Vdwl+Vdbl) which is obtained by adding the amount of drop of voltages (Vdwl and Vdbl) caused by the word line WL<m> and the bit line BL<n> to the reference voltage Vref. The reference voltage generator 72 supplies the generated voltage Vref+Vdbl+Vdwl to the comparator 71 as the reference voltage.

The comparator 71 compares the voltage VBL (Vcell+Vdwl+Vdbl) of the selected bit line BL and the reference voltage Vref' (Vref+Vdwl+Vdbl). Thus, the possibility that the sense amplifier 20 determines the data stored in the memory cell MC wrongly can be reduced. This can improve the operational reliability of the memory device 3.

3. Third Embodiment

A memory device according to a third embodiment will be described. The memory device according to the third embodiment differs from that of the first embodiment in the configuration of the write/read circuit 17. In the following description, points different from those of the first embodiment will mainly be described.

3.1 Configuration of Write/Read Circuit

The configuration of the write/read circuit 17 will be described with reference to FIGS. 14 and 15. FIGS. 14 and 15 are circuit diagrams each showing an example of the configuration of the write/read circuit 17. FIGS. 14 and 15 also show the memory cell array 10, the row selection circuit 14 and the column selection circuit 15 as well as the write/read circuit 17. Note that the read driver 19 is not shown. FIG. 14 shows a connection state of each circuit in the case of "0" write. FIG. 15 shows a connection state of each circuit in the case of "1" write.

The write/read circuit 17 is connectable to the word lines WL via the row selection circuit 14. The write/read circuit 17 is connectable to the bit lines BL via the column selection circuit 15.

The write driver 18 is, for example, a voltage driver circuit. The write driver 18 supplies the write voltage to the row selection circuit 14 or the column selection circuit 15.

The row selection circuit 14 supplies the write voltage to the memory cell array 10 via the selected word line WL. The column selection circuit 15 supplies the write voltage to the memory cell array 10 via the selected bit line BL.

The write driver 18 includes a voltage source 44. The voltage source 44 is a circuit configured to output a voltage Vw based on the feedback values fb2 and fb3. The voltage Vw is the write voltage. The voltage VDD is applied to the voltage source 44. The voltage source 44 is connected to the node ND1. The voltage source 44 outputs the voltage Vw based on the feedback values fb2 and fb3. The voltage Vw is supplied to the node ND1. That is, the write driver 18 outputs the voltage Vw to the node ND1.

The feedback circuit 21 includes current detection circuits 52 and 54.

The current detection circuit 52 has a configuration similar to that of the current detection circuit 52 shown in the first embodiment. The voltage Vusel is applied to the current detection circuit 52. The current detection circuit 52 is connected to the global bit line GBL1 and the voltage source 44. The current detection circuit 52 generates the feedback value fb2 based on the current detected by the ammeter 53. The feedback value fb2 may be the detected current, a value (voltage value) obtained by converting the detected current into a voltage, or a signal based on the detected current. The current detection circuit 52 feeds the generated feedback value fb2 back to the voltage source 44.

The current detection circuit 54 has a configuration similar to that of the current detection circuit 54 shown in the first embodiment. The voltage Vusel is applied to the current detection circuit 54. The current detection circuit 54 is connected to the global word line GWL1 and the voltage source 44. The current detection circuit 54 generates the feedback value fb3 based on the current detected by the ammeter 55. The feedback value fb3 may be the detected current, a value (voltage value) obtained by converting the detected current into a voltage, or a signal based on the detected current. The current detection circuit 54 feeds the generated feedback value fb3 back to the voltage source 44.

3.2 Write Operation

The write operation will be described. First, the write operation in the case of "0" write will be described with reference to FIG. 16. FIG. 16 is a diagram illustrating the write operation in the case of "0" write.

The feedback circuit 21 outputs the feedback values fb2 and fb3 to the voltage source 44. The write driver 18 outputs the voltage Vw based on the feedback values fb2 and fb3 to the node ND1. The write/read circuit 17 supplies the voltage Vw to the row selection circuit 14.

The row selection circuit 14 applies the voltage Vw to the selected word line WL (word line WL<3>), for example. The column selection circuit 15 applies the voltage VSS to the selected bit line BL (bit line BL<3>), for example.

The row selection circuit 14 applies the voltage Vusel to a plurality of non-selected word lines WL (word lines WL<0> to WL<2> and WL<4> to WL<6>), for example. The column selection circuit 15 applies the voltage Vusel to a plurality of non-selected bit lines BL (bit lines BL<0> to BL<2> and BL<4> to BL<6>), for example.

In the case where the potential difference Vcell applied to the selected memory cell MC becomes equal to or higher than the threshold voltage Vth as in the case of "0" write shown in the first embodiment, a current flows from the selected word line WL to the selected memory cell MC. The current Icell flows from the selected memory cell MC to the second ground terminal through the selected bit line BL and the column selection circuit 15.

Although a potential difference applied to a plurality of half-selected memory cells MC among the memory cells MC connected to the selected word line WL is controlled below the threshold voltage Vth, a minute leakage current Ilkb flows from the selected word line WL to each of the half-selected memory cells MC. The leakage current Ilkb flows to the current detection circuit 52 through each of the non-selected bit lines BL and the column selection circuit 15. The leakage current IleakBL (ΣIlkb) flows through current detection circuit 52.

Although a potential difference applied to a plurality of half-selected memory cells MC among the memory cells MC connected to the selected bit line BL is controlled below the threshold voltage Vth, a minute leakage current Ilkw flows from the current detection circuit 54 to each of the half-selected memory cells MC through the each of non-selected word lines WL. The leakage current Ilkw flows to the second ground terminal through the selected bit line BL and the column selection circuit 15. A current Icell+IleakWL flows to the second ground terminal.

The current detection circuit 52 detects the leakage current IleakBL and generates the feedback value fb2 based on the detected current. The current detection circuit 52 feeds the generated feedback value fb2 back to the voltage source 44.

The current detection circuit 54 detects the leakage current IleakWL and generates the feedback value fb3 based on the detected current. The current detection circuit 54 feeds the generated feedback value fb3 back to the voltage source 44.

The voltage source 44 outputs the voltage Vw based on the feedback values fb2 and fb3. In other words, the voltage Vw is based on the leakage current IleakBL flowing through the non-selected bit lines BL (half-selected memory cells MC one end of each of which is connected to the selected word line WL and the other end of each of which is connected to each of the non-selected bit lines BL) and the leakage current IleakWL flowing through the non-selected word lines WL (half-selected memory cells MC one end of each of which is connected to the selected bit line BL and the other end of each of which is connected to each of the non-selected word lines WL).

In the case where the interconnect resistance of the word lines WL and the bit lines BL cannot be ignored, the voltage Vapp1 is equal to a voltage obtained by adding the amount of drop of voltages (Vdwl and Vdbl) caused by the word line WL<m> and the bit line BL<n> to the potential difference Vcell applied to the selected memory cell MC, as in the case of "0" write shown in the first embodiment.

Assume here that a constant voltage applied (supplied) to the selected memory cell MC is "voltage Vw0." In order to apply the voltage Vw0 to the selected memory cell MC, the voltage source 44 outputs a voltage, which is obtained by adding the amount of drop of voltages (Vdwl and Vdbl) caused by the word line WL<m> and the bit line BL<n> to the voltage Vw0, to the node ND1 as the voltage Vw. For example, the voltage source 44 generates the voltage Vdbl based on the feedback value fb2. The voltage source 44 generates the voltage Vdwl based on the feedback value fb3. The voltage source 44 generates a voltage (Vw0+Vdwl+Vdbl) obtained by adding the voltages Vdwl and Vdbl to the voltage Vw0. The voltage source 44 outputs the generated voltage Vw0+Vdbl+Vdwl to the node ND1 as the voltage Vw. The voltage source 44 generates IleakBL×Rwl as the voltage Vdwl, for example. The voltage source 44 generates IleakWL×Rbl as the voltage Vdbl, for example.

(Waveforms of Various Voltages and Currents During Write Operation)

The waveforms of various voltages and currents during the write operation will be described with reference to FIGS. 17 and 18. FIG. 17 is a graph showing the waveform of the voltage Vapp1 during the write operation in the case of "0" write. FIG. 18 is a graph showing the waveforms of the currents Icell and IleakBL during the write operation in the case of "0" write.

During the period from time t11 to time t12, the voltage Vusel is supplied to the row selection circuit 14 as the voltage Vw. During this period, the voltage Vapp1 is the voltage Vusel. Therefore, no current flows through the selected memory cell MC until the potential difference Vcell applied to the selected memory cell MC becomes equal to or higher than the threshold voltage Vth. As in the first embodiment, the half-selected memory cells MC connected to the selected word line WL are not turned on. However, a minute leakage current Ilkb flows through each of the half-selected memory cells MC connected to the selected word line WL. Thus, the sum (IleakBL) of leakage currents Ilkb from all the half-selected memory cells MC connected to the selected word line WL increases.

At time t12, in the case where the voltage Vw0 is supplied to the row selection circuit 14 as the voltage Vw, the voltage Vapp1 becomes the voltage Vw0. Accordingly, the switching element SEL of the selected memory cell MC is turned on.

During the period from time t12 to time t13, the waveform of the voltage Vapp1 is similar to that during the period from time t2 to time t3 shown in FIG. 7 of the first embodiment. The constant voltage Vw0 is supplied to the selected memory cell MC regardless of the amount of voltage drop caused by the word line WL<m> and the bit line BL<n>. The waveform of the current Icell is similar to that during the period from time t2 to time t3 shown in FIG. 8 of the first embodiment. The waveform of the current IleakBL is similar to that of the current Ifb during the period from time t2 to time t3 shown in FIG. 8 of the first embodiment.

Next, the write operation in the case of "1" write will be described with reference to FIG. 19. FIG. 19 is a diagram illustrating the write operation in the case of "1" write.

The feedback circuit 21 outputs the feedback values fb2 and fb3 to the voltage source 44. The write driver 18 outputs the voltage Vw to the node ND1 based on the feedback values fb2 and fb3. The write/read circuit 17 supplies the voltage Vw to the column selection circuit 15.

The column selection circuit 15 supplies the voltage Vw to the selected bit line BL (bit line BL<3>), for example. The row selection circuit 14 applies the voltage VSS to the selected word line WL (word line WL<3>), for example.

The column selection circuit 15 applies the voltage Vusel to a plurality of non-selected bit lines BL (bit lines BL<0> to BL<2> and BL<4> to BL<6>), for example. The row selection circuit 14 applies the voltage Vusel to a plurality of non-selected word lines WL (word lines WL<0> to WL<2> and WL<4> to WL<6>), for example.

In the case where the potential difference Vcell applied to the selected memory cell MC becomes equal to or higher than the threshold voltage Vth as in the case of "1" write shown in the first embodiment, the current Icell flows from the selected bit line BL to the selected memory cell MC. The current Icell flows from the selected memory cell MC to the first ground terminal through the selected word line WL and the row selection circuit 14.

Although the potential difference applied to a plurality of half-selected memory cells MC among the memory cells MC connected to the selected bit line BL is controlled below the threshold voltage Vth, a minute leakage current Ilkw flows from the selected bit line BL to each of the half-selected memory cells MC. The leakage current Ilkw flows to the current detection circuit 54 through each of the non-selected word lines WL and the row selection circuit 14. The leakage current IleakWL (ΣIlkw) flows through the current detection circuit 54.

Although the potential difference applied to a plurality of half-selected memory cells MC among the memory cells MC connected to the selected word line WL is controlled below the threshold voltage Vth, a minute leakage current Ilkb flows from the current detection circuit 52 to each of the half-selected memory cells MC through each of the non-selected bit lines BL. The leakage current Ilkb flows to the first ground terminal through the select word line WL and the row selection circuit 14. A current Icell+IleakBL (ΣIlkb) flows to the first ground terminal.

The operations of the current detection circuits 52 and 54 and voltage source 44 are similar to those in the case of "0" write.

(Waveforms of Various Voltages and Currents During Write Operation)

The waveforms of various voltages and currents during the write operation in the case of "1" write are the same as those in the case of "0" write, except that the voltage Vapp1 in FIG. 17 is replaced by the voltage Vapp2 and the current IleakBL in FIG. 18 is replaced by the current IleakWL.

3.3 Advantageous Effect of Third Embodiment

According to the third embodiment, a constant voltage can be supplied to a memory cell MC regardless of the address of the memory cell MC. This advantageous effect will be described below.

In the case where the write driver 18 supplies the write voltage Vw to the selected word line WL via the row selection circuit 14, the leakage current Ilkb flows through each of the half-selected memory cells MC connected to the selected word line WL, and the leakage current Ilkw flows through each of the half-selected memory cells MC connected to the selected bit line BL. This causes a voltage drop to occur at the word line WL<m> and the bit line BL<n>. Thus, the potential difference Vcell applied to the selected memory cell MC becomes equal to a difference (Vw0-Vdwl-Vdbl) between the voltage Vw0 and the amount of drop of voltages (Vdwl and Vdbl) caused by the word line WL<m> and the bit line BL<n>. That is, the potential difference Vcell becomes lower than the voltage Vw0. The same is true of the case where the write driver 18 supplies the write voltage Vw to the selected bit line BL via the column selection circuit 15.

In the third embodiment, the write/read circuit 17 includes the write driver 18 and the feedback circuit 21.

The write driver 18 includes the voltage source 44.

The feedback circuit 21 includes the current detection circuits 52 and 54.

The current detection circuit 52 generates the feedback value fb2 based on the detected leakage current IleakBL. The current detection circuit 52 feeds the generated feedback value fb2 back to the voltage source 44.

The current detection circuit 54 generates the feedback value fb3 based on the detected leakage current IleakWL. The current detection circuit 54 feeds the generated feedback value fb3 to the voltage source 44. As described above, in the case where the interconnect resistance of the word lines WL and the bit lines BL cannot be ignored, the voltage Vapp1 is equal to a voltage obtained by adding the amount of drop of voltages (Vdwl and Vdbl) caused by the word line WL<m> and the bit line BL<n> to the potential difference Vcell applied to the selected memory cell MC, as in the case of "0" write shown in the first embodiment.

In order to apply the voltage Vw0 to the selected memory cell MC, the voltage source 44 outputs, as the voltage Vw, a voltage (Vw0+Vdwl+Vdbl) obtained by adding the amount of drop of voltages (Vdwl and Vdbl) caused by the word line WL<m> and the bit line BL<n> to the voltage Vw0. That is, the write driver 18 outputs the voltage Vw0+Vdwl+Vdbl as the write voltage Vw.

The write/read circuit 17 supplies the voltage Vw0+Vdwl+Vdbl to the row selection circuit 14 or the column selection circuit 15 as the write voltage Vw. Since the voltage Vw0+Vdwl+Vdbl is supplied to the selected word line WL through the row selection circuit 14, the potential difference Vcell applied to the selected memory cell MC becomes a difference (Vw0) between the voltage Vw0+Vdwl+Vdbl and the amount of drop of voltages (Vdwl and Vdbl) caused by the word line WL<m> and the bit line BL<n>. That is, the potential difference Vcell is equal to the voltage Vw0. The same is true of the case where the write voltage Vw is supplied to the selected bit line BL via the column selection circuit 15. Therefore, according to the third embodiment, the constant voltage Vw0 can be supplied to a memory cell MC regardless of the address of the memory cell MC.

4. Fourth Embodiment

A memory device according to a fourth embodiment will be described. The memory device according to the fourth embodiment differs from that of the third embodiment in the configuration of the write/read circuit 17. In the following description, points different from those of the third embodiment will mainly be described.

4.1 Configuration of Write/Read Circuit

The configuration of the write/read circuit 17 will be described with reference to FIG. 20. FIG. 20 is a circuit diagram showing an example of the configuration of the write/read circuit 17. FIG. 20 also shows the memory cell array 10, the row selection circuit 14 and the column selection circuit 15 as well as the write/read circuit 17. Note that the write driver 18 is not shown.

The read driver 19 is, for example, a voltage driver circuit. The read driver 19 supplies the read voltage to the column selection circuit 15. The column selection circuit 15 supplies the read voltage to the memory cell array 10 via the selected bit line BL.

The read driver 19 includes a voltage source 64. The voltage source 64 is a circuit configured to output a voltage Vr based on the feedback values fb2 and fb3. The voltage Vr is the read voltage. The voltage VDD is applied to the voltage source 64. The voltage source 64 is connected to the node ND1. The voltage source 64 outputs the voltage Vr based on the feedback values fb2 and fb3. The voltage Vr is supplied to the node ND1. That is, the read driver 19 outputs the voltage Vr to the node ND1.

The current detection circuit 52 generates the feedback value fb5 based on the current detected by the ammeter 53 in addition to the process shown in the third embodiment. The feedback value fb5 may be the detected current, a value (voltage value) obtained by converting the detected current into a voltage or a signal based on the detected current. The current detection circuit 52 further feeds the generated feedback value fb5 back to the reference voltage generator 72.

The current detection circuit 54 generates the feedback value fb6 based on the current detected by the ammeter 55 in addition to the process shown in the third embodiment. The feedback value fb6 may be the detected current, a value (voltage value) obtained by converting the detected current into a voltage or a signal based on the detected current. The current detection circuit 54 further feeds the generated feedback value fb6 back to the reference voltage generator 72.

The configuration of the sense amplifier 20 is similar to that of the sense amplifier 20 shown in the second embodiment.

4.2 Read Operation

The read operation will be described with reference to FIG. 21. FIG. 21 is a diagram illustrating the read operation.

The feedback circuit 21 outputs the feedback values fb2 and fb3 to the voltage source 64. The read driver 19 outputs the voltage Vr based on the feedback values fb2 and fb3 to the node ND1. The write/read circuit 17 supplies the voltage Vr to the column selection circuit 15.

The column selection circuit 15 applies the voltage Vr to the selected bit line BL (bit line BL<3>), for example. The row selection circuit 14 applies the voltage VSS to the selected word line WL (word line WL<3>), for example.

In addition, the column selection circuit 15 applies the voltage Vusel to a plurality of non-selected bit lines BL (Bit lines BL<0> to BL<2> and BL<4> to BL<6>), for example. The row selection circuit 14 applies the voltage Vusel to a plurality of non-selected word lines WL (word lines WL<0> to WL<2> and WL<4> to WL<6>), for example.

In the case where the potential difference Vcell applied to the selected memory cell MC becomes equal to or higher than the threshold voltage Vth as in the case of "1" write shown in the third embodiment, the current Icell flows from the selected bit line BL to the selected memory cell MC. The current Icell flows from the selected memory cell MC to the first ground terminal through the selected word line WL and the row selection circuit 14.

Although the potential difference applied to a plurality of half-selected memory cells MC among the memory cells MC connected to the selected bit line BL is controlled below the threshold voltage Vth, a minute leakage current Ilkw flows from the selected bit line BL to each of the half-selected memory cells MC. The leakage current Ilkw flows to the current detection circuit 54 through each of the non-selected word lines WL and the row selection circuit 14. The leakage current IleakWL (ΣIlkw) flows through the current detection circuit 54.

Although the potential difference applied to a plurality of half-selected memory cells MC among the memory cells MC connected to the selected word line WL is controlled below the threshold voltage Vth, a minute leakage current Ilkb flows from the current detection circuit 52 to each of the half-selected memory cells MC through each of the non-selected bit lines BL. The leakage current Ilkb flows to the first ground terminal through the selected word line WL and the row selection circuit 14. A current Icell+IleakBL (ΣIlkb) flows to the first ground terminal.

Like in the third embodiment, the current detection circuit 52 generates the feedback value fb2 based on the leakage current IleakBL and feeds the generated feedback value fb2 back to the voltage source 64.

Like in the third embodiment, the current detection circuit 54 generates the feedback value fb3 based on the leakage current IleakWL and feeds the generated feedback value fb3 back to the voltage source 64.

The voltage source 64 outputs the voltage Vr based on the feedback values fb2 and fb3. In other words, the voltage Vr is based on the leakage current IleakBL flowing through the non-selected bit lines BL (half-selected memory cells MC one end of each of which is connected to the selected word line WL and the other end of each of which is connected to each of the non-selected bit lines BL) and the leakage current IleakWL flowing through the non-selected word lines WL (half-selected memory cells MC one end of each of which is connected to the selected bit line BL and the other end of each of which is connected to each of the non-selected word lines WL).

Assume here that the constant voltage applied (supplied) to the selected memory cell MC is "voltage Vr0." In order to apply the voltage Vr0 to the selected memory cell MC, the voltage source 64 outputs a voltage, which is obtained by adding the amount of drop of voltages (Vdwl and Vdbl) caused by the word line WL<m> and the bit line BL<n> to the voltage Vr0, to the node ND1 as the voltage Vr. For example, the voltage source 64 generates the voltage Vdbl based on the feedback value fb2. The voltage source 64 generates the voltage Vdwl based on the feedback value fb3. The voltage source 64 generates a voltage (Vw0+Vdwl+Vdbl) obtained by adding the voltages Vdwl and Vdbl to the voltage Vr0. The voltage source 64 outputs the generated voltage Vr0+Vdbl+Vdwl to the node ND1 as the voltage Vr. The voltage source 64 generates IleakBL×Rwl as the voltage Vdwl, for example. The voltage source 64 generates IleakWL×Rbl as the voltage Vdbl, for example.

The current detection circuit 52 detects the leakage current IleakBL and generates the feedback value fb5 based on the detected current in addition to the process shown in the third embodiment. The current detection circuit 52 further feeds the generated feedback value fb5 back to the reference voltage generator 72.

The current detection circuit 54 detects the leakage current IleakWL and generates the feedback value fb6 based on the detected current in addition to the process shown in the third embodiment. The current detection circuit 54 further feeds the generated feedback value fb6 back to the reference voltage generator 72.

The operation of the sense amplifier 20 is similar to that of the sense amplifier 20 shown in the second embodiment.

4.3 Advantageous Effect of Fourth Embodiment

Like in the third embodiment, in the fourth embodiment, the feedback circuit 21 feeds back the feedback values fb2 and fb3. Like the write driver 18 shown in the third embodiment, the read driver 19 generates the voltage Vr0+Vdwl+Vdbl based on the feedback values fb2 and fb3 and outputs the generated voltage Vr0+Vdwl+Vdbl as the read voltage Vr. The write/read circuit 17 supplies the voltage Vr0+Vdwl+Vdbl to the column selection circuit 15 as the read voltage Vr. Accordingly, the constant voltage Vr0 is supplied to the selected memory cell MC regardless of the amount of voltage drop caused by the word line WL<m> and the bit line BL<n>. Therefore, the fourth embodiment brings about the same advantageous effect as that of the third embodiment.

Like in the second embodiment, in the fourth embodiment, the current detection circuit 52 feeds the feedback value fb5 back to the reference voltage generator 72. Like in the second embodiment, the current detection circuit 54 feeds the feedback value fb6 back to the reference voltage generator 72. The reference voltage generator 72 generates the voltage Vref' (Vref+Vdwl+Vdbl) obtained by adding the amount of drop of voltages (Vdwl and Vdbl) caused by the word line WL<m> and the bit line BL<n> to the reference voltage Vref. Therefore, like the second embodiment, the fourth embodiment can improve the operational reliability of the memory device 3.

5. Modifications and Others

As described above, a memory device according to an embodiment includes a first memory cell (MC), a second memory cell (MC), a first interconnect (WL/BL) connected to the first memory cell (MC) and the second memory cell (MC), a second interconnect (BL/WL) connected to the second memory cell (MC), and a third circuit (17). The third circuit (17) includes a first circuit (18/19) connectable to the first interconnect (WL/BL) and the second interconnect (BL/WL) and a second circuit (21) connectable to the first interconnect (WL/BL) and the second interconnect (BL/WL). During a write operation or a read operation for the first memory cell (MC), the first circuit (18/19) outputs a first current (Iw/Ir) to be supplied to the first memory cell (MC), the second circuit (21) outputs a third current (Ifb) based on a second current (Ilkb/Ilkw) which flows through the second interconnect (BL/WL), and the third circuit (17) supplies a sum of the first current (Iw/Ir) and the third current (Ifb) to the first interconnect (WL/BL).

None of the embodiments is limited to the above, but various modification can be made.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first memory cell;
a plurality of second memory cells;
a first interconnect connected to the first memory cell and the plurality of second memory cells;
a plurality of second interconnects connected to the plurality of second memory cells, respectively; and
a third circuit including a first circuit configured to connect to the first interconnect and the plurality of second interconnects and a second circuit configured to connect to the first interconnect and the plurality of second interconnects,
wherein, during a write operation or a read operation for the first memory cell:
the first circuit outputs a first current to be supplied to the first memory cell;
the second circuit outputs a third current based on second currents which flow through the plurality of second interconnects; and
the third circuit supplies a sum of the first current and the third current to the first interconnect.
2. The device according to claim 1, wherein the third current is equal to a sum of the second currents which flow through the plurality of second interconnects.

3. The device according to claim 1, wherein the second circuit includes:

a fourth circuit which generates a first value based on a sum of the second currents which flow through the plurality of second interconnects; and a fifth circuit which outputs the third current based on the first value.

4. The device according to claim 1, further comprising:

a plurality of third memory cells;

a third interconnect connected to the first memory cell and the plurality of third memory cells; and a plurality of fourth interconnects connected to the plurality of third memory cells, respectively, wherein:

the third circuit further includes a sixth circuit configured to connect to the first interconnect and the plurality of fourth interconnects; and during the read operation for the first memory cell, the sixth circuit determines data stored in the first memory cell based on a first voltage of the first interconnect and a second voltage based on a sum of the second currents which flow through the plurality of second interconnects and a sum of fourth currents which flow through the plurality of fourth interconnects.

5. The device according to claim 4, wherein the sixth circuit includes:

a seventh circuit which generates the second voltage; and an eighth circuit which compares the first voltage and the second voltage.

6. The device according to claim 4, wherein the second voltage is a voltage obtained by adding an amount of voltage drop caused by the first interconnect and an amount of voltage drop caused by the third interconnect to a third voltage.

7. The device according to claim 4, wherein the second voltage is a voltage obtained by adding a product of an interconnect resistance of the first interconnect and the sum of the second currents and a product of an interconnect resistance of the third interconnect and the sum of the fourth currents to a third voltage.

8. The device according to claim 4, wherein:

the second circuit includes a ninth circuit which generates a second value based on the sum of the second currents, and a tenth circuit which generates a third value based on the sum of the fourth currents; and during the read operation for the first memory cell, the sixth circuit determines data stored in the first memory cell based on the first voltage and the second voltage based on the second value and the third value.

9. The device according to claim 1, wherein the first memory cell and the plurality of second memory cells each include a variable resistance element.

10. The device according to claim 9, wherein the variable resistance element is a magnetoresistance effect element.

11. A memory device comprising:

a first memory cell;

a plurality of second memory cells;

a plurality of third memory cells;

a first interconnect connected to the first memory cell and the plurality of second memory cells;

a plurality of second interconnects connected to the plurality of second memory cells, respectively;

a third interconnect connected to the first memory cell and the plurality of third memory cells;

a plurality of fourth interconnects connected to the plurality of third memory cells, respectively; and a first circuit configured to connect to the first interconnect, the plurality of second interconnects, the third interconnect, and the plurality of fourth interconnects, wherein during a write operation or a read operation for the first memory cell, the first circuit supplies the first interconnect with a first voltage based on first currents which flow through the plurality of second interconnects and second currents which flow through the plurality of fourth interconnects.

12. The device according to claim 11, wherein the first voltage is a voltage obtained by adding an amount of voltage drop caused by the first interconnect and an amount of voltage drop caused by the third interconnect to a second voltage supplied to the first memory cell.

13. The device according to claim 11, wherein the first voltage is a voltage obtained by adding a product of an interconnect resistance of the first interconnect and a sum of the first currents which flow through the plurality of second interconnects and a product of an interconnect resistance of the third interconnect and a sum of the second currents which flow through the plurality of fourth interconnects to a second voltage supplied to the first memory cell.

14. The device according to claim 11, wherein:

the first circuit further includes a second circuit and a third circuit;

the third circuit includes a fourth circuit which generates a first value based on a sum of the first currents which flow through the plurality of second interconnects, and a fifth circuit which generates a second value based on a sum of the second currents which flow through the plurality of fourth interconnects; and the second circuit outputs the first voltage based on the first value and the second value.

15. The device according to claim 11, wherein:

the first circuit further includes a sixth circuit connectable to the first interconnect and the plurality of fourth interconnects; and during the read operation for the first memory cell, the sixth circuit determines data stored in the first memory cell based on a third voltage of the first interconnect and a fourth voltage based on a sum of the first currents which flow through the plurality of second interconnects and a sum of the second currents which flow through the plurality of fourth interconnects.

16. The device according to claim 15, wherein the sixth circuit includes:

a seventh circuit which generates the fourth voltage; and an eighth circuit which compares the third voltage and the fourth voltage.

17. The device according to claim 15, wherein the fourth voltage is a voltage obtained by adding an amount of voltage drop caused by the first interconnect and an amount of voltage drop caused by the third interconnect to a fifth voltage.

18. The device according to claim 15, wherein the fourth voltage is a voltage obtained by adding a product of an interconnect resistance of the first interconnect and the sum of the first currents and a product of an interconnect resistance of the third interconnect and the sum of the second currents to a fifth voltage.

19. The device according to claim 15, wherein:

the first circuit further includes a ninth circuit;

the ninth circuit includes a tenth circuit which generates a third value based on the sum of the first currents and an eleventh circuit which generates a fourth value based on the sum of the second currents; and during the read operation for the first memory cell, the sixth circuit determines data stored in the first memory cell based on the third voltage and the fourth voltage based on the third value and the fourth value.

20. The device according to claim 11, wherein the first memory cell, the plurality of second memory cells, and the plurality of third memory cells each include a variable resistance element.

\* \* \* \* \*